(12) United States Patent
Suehira et al.

(10) Patent No.: US 9,046,793 B2
(45) Date of Patent: Jun. 2, 2015

(54) LIGHT TRANSMISSIVE MOLD AND APPARATUS FOR IMPRINTING A PATTERN ONTO A MATERIAL APPLIED ON A SEMICONDUCTOR WORKPIECE AND RELATED METHODS

(75) Inventors: Nobuhito Suehira, Kawasaki (JP); Junichi Seki, Yokohama (JP); Masao Majima, Isehara (JP); Atsunori Terasaki, Kawasaki (JP); Hideki Ina, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/153,512

(22) Filed: Jun. 6, 2011

(65) Prior Publication Data

US 2011/0272840 A1 Nov. 10, 2011

Related U.S. Application Data

(62) Division of application No. 12/842,118, filed on Jul. 23, 2010, now Pat. No. 8,770,958, which is a division of application No. 11/448,009, filed on Jun. 7, 2009, now Pat. No. 7,794,222.

(30) Foreign Application Priority Data

Jun. 8, 2005 (JP) .................................. 2005-168842
Oct. 17, 2005 (JP) .................................. 2005-302225
Oct. 18, 2005 (JP) .................................. 2005-302703
May 17, 2006 (JP) .................................. 2006-137319

(51) Int. Cl.
*B29C 59/02* (2006.01)
*G03F 9/00* (2006.01)
(Continued)

(52) U.S. Cl.
CPC .............. *G03F 9/7084* (2013.01); *B82Y 10/00* (2013.01); *B82Y 40/00* (2013.01); *G03F 7/0002* (2013.01); *G03F 9/7076* (2013.01)

(58) Field of Classification Search
CPC ....... G03F 7/0002; G03F 9/70; G03F 9/7042; G03F 9/7046; G03F 9/7073; G03F 9/7084
USPC .............. 425/150, 385, 174, 174.4; 264/293, 264/496, 446, 39, 40.5
See application file for complete search history.

(56) References Cited

U.S. PATENT DOCUMENTS 6,387,787 B1 5/2002 Mancini et al.
6,921,615 B2 7/2005 Sreenivasan et al.
(Continued)

FOREIGN PATENT DOCUMENTS

EP 1 526 411 A1 4/2005
EP 1 533 657 A1 5/2005
(Continued)

OTHER PUBLICATIONS

Communication pursuant to Article 94(3) EPC, mailed in a Communication dated Aug. 13, 2009, in copending European patent application No. 09 159 795.5.
(Continued)

*Primary Examiner* — Timothy Kennedy
(74) *Attorney, Agent, or Firm* — Fitzpatrick, Cella, Harper & Scinto

(57) ABSTRACT

A light transmissive mold used for imprinting a pattern onto a material applied on a semiconductor workpiece. The mold includes a first surface having an area of a pattern to be imprinted onto the material, a second surface located opposite from the first surface, and a third surface disposed between the first surface and the second surface, at a position inwardly away from the first surface. The third surface is arranged opposite to an area of the workpiece subjected to dicing. An alignment structure, provided for alignment between the mold and the workpiece, is formed in the third surface.

12 Claims, 24 Drawing Sheets

(51) Int. Cl.
*B82Y 10/00* (2011.01)
*B82Y 40/00* (2011.01)
*G03F 7/00* (2006.01)

(56) References Cited

U.S. PATENT DOCUMENTS

| | | |
|---|---|---|
| 7,401,549 B2 | 7/2008 | Staecker et al. |
| 7,462,548 B2 | 12/2008 | Van Haren |
| 2003/0034329 A1 | 2/2003 | Chou |
| 2003/0224262 A1 | 12/2003 | Lof et al. |
| 2004/0007799 A1 | 1/2004 | Choi et al. |
| 2004/0219803 A1 | 11/2004 | Staecker et al. |
| 2005/0064344 A1 | 3/2005 | Bailey et al. |
| 2005/0202350 A1 | 9/2005 | Colburn et al. |
| 2006/0272535 A1 | 12/2006 | Seki et al. |
| 2006/0279004 A1 | 12/2006 | Suehira et al. |
| 2006/0279022 A1 | 12/2006 | Seki et al. |

FOREIGN PATENT DOCUMENTS

| | | |
|---|---|---|
| JP | 2003-323461 A | 11/2000 |
| JP | 2004-335808 A | 11/2004 |
| JP | 2005-134690 A | 5/2005 |
| WO | 01/33300 A2 | 5/2001 |
| WO | 02/08835 A2 | 1/2002 |
| WO | 2005/031855 A1 | 4/2005 |

OTHER PUBLICATIONS

Taiwan Office Action dated Jun. 17, 2009, including Search Report completed on Mar. 12, 2009, cited in corresponding Taiwan patent application No. 095120233, with English translation.

Communication pursuant to Article 94(3) EPC, mailed in a Communication dated Dec. 30, 2008, in copending European patent application No. 06 115 087.6.

English translation of Chinese Office Action dated Feb. 29, 2008, issued in corresponding Chinese patent application No. 2006-10091716.2.

White, D.L., and O.R. Wood, II. "Novel alignment system for imprint lithography," J. Vac. Sci. Technol. B 18(6), Nov./Dec. 2000. pp. 3552-3556.

European Search Report dated Jul. 6, 2007, issued in corresponding European patent application No. EP 06 11 5087.6, forwarded in a Communication dated Jul. 19, 2007.

Chou, Stephen Y., et al. "Imprint of sub-25 nm vias and trenches in polymers," Appl. Phys. Lett., vol. 67, Issue 21, Nov. 20, 1995. pp. 3114-3116.

Chinese Official Action dated Aug. 23, 2010, issued in counterpart Chinese patent application No. 2009101409391, with an English translation.

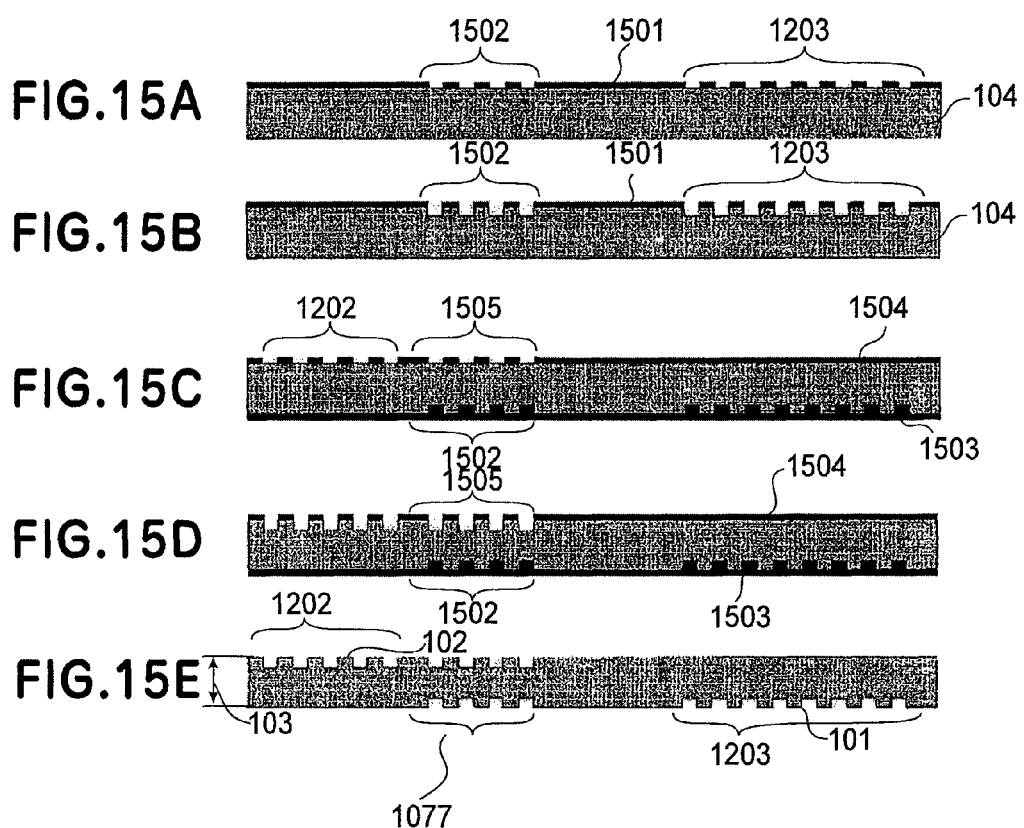

LIGHT TRANSMISSIVE MOLD AND APPARATUS FOR IMPRINTING A PATTERN ONTO A MATERIAL APPLIED ON A SEMICONDUCTOR WORKPIECE AND RELATED METHODS

RELATED METHODS

This application is a divisional application of copending U.S. patent application Ser. No. 12/842,118, filed on Jul. 23, 2010, which is a divisional application of U.S. patent application Ser. No. 11/448,009, filed on Jun. 7, 2006, and which issued as U.S. Pat. No. 7,794,222 on Sep. 14, 2010.

This application also claims priority from Japanese Patent Applications No. 2005-168842, filed Jun. 8, 2005, No. 2005-302225, filed Oct. 17, 2005, No. 2005-302703, filed Oct. 18, 2005, and No. 2006-137319, filed May 17, 2006, which are hereby incorporated by reference herein.

FIELD OF THE INVENTION AND RELATED ART

The present invention relates to a mold, a pattern forming method, and a pattern forming apparatus, which are used for forming a pattern. More specifically, the present invention relates to technology for aligning a mold with a substrate.

In recent years, fine processing technology for transferring a minute pattern structure on a mold onto a member, such as a resin or a metal, has been developed. This technology is called nanoimprint or nanoembossing, and is expected to realize a resolution on the order of several nanometers, so that it has received attention as next-generation semiconductor fabrication technology in place of a light exposure apparatus, such as a stepper or a scanner. Further, according to the nanoimprint, a space structure can be formed on a wafer as a whole, although it varies depending on a size of the wafer, so that the nanoimprint technology has been expected to be applied to a wide variety of fields of production technologies of optical devices, such as photonic crystals and biochips, such as µ-TAS (Micro Total Analysis System).

A case when processing by the nanoimprint is applied to semiconductor production has been described in Stephan Y. Chou et al., Appl. Phys. Lett. Vol. 67, Issue 21, pages 3114-3116 (1995). More specifically, on a work or workpiece (a semiconductor wafer in this case), a layer of photocurable resin is formed. Then, a mold having a desired uneven pattern is pressed against the resin, followed by irradiation with light under pressure to cure the resin. As a result of curing of the layer of the photocurable resin, the uneven pattern of the mold is transferred onto the work. When etching, or the like, is effected with the cured resin layer as a mask, pattern formation on the semiconductor wafer can be realized.

In the imprint technology, it is necessary to precisely effect (positional) alignment of the mold with the work during the pattern transfer.

The alignment is generally effected by optically reading an alignment structure (hereinafter also referred to as an alignment mark) provided to the mold and an alignment mark provided to the work, such as the semiconductor wafer, from the mold side.

However, in the case wherein a resin onto which a pattern of the mold is transferred is interposed between the mold and the work, the following problem can be caused to occur.

More specifically, the resin is caused to contact the alignment mark on the mold side, whereby the alignment mark is unclearly observed in some cases. Further, in the case wherein a difference in a refractive index between the mold and the resin is insufficient, the alignment mark is particularly less visible.

SUMMARY OF THE INVENTION

An object of the present invention is to provide a mold capable of being applied to high accuracy alignment.

Another object of the present invention is to provide a pattern forming method using the mold and a pattern forming apparatus for effecting such pattern formation.

One aspect of the present invention is to provide a mold, comprising:

a first surface having an area of a pattern to be transferred;
a second surface located opposite from the first surface; and
an alignment mark embedded in the mold so as not to be exposed on the first surface and the second surface.

Another aspect of the present invention is to provide a mold, comprising:

a first surface having an area of a pattern to be transferred;
a second surface located opposite from the first surface;
a first mark provided at the first surface; and
a second mark for alignment provided at a position at which the second mark is away from the first surface.

Yet another aspect of the present invention is to provide a pattern forming method for forming an imprinted pattern on a coating material disposed on a substrate with a pattern provided to a mold, comprising:

preparing a mold provided with a first surface including a pattern area, a second surface located opposite from the first surface, and an alignment mark provided at a position at which the alignment mark is away from the first surface;
contacting the pattern area of the mold with the coating material disposed on the substrate;
obtaining information about positions of the mold and the substrate by using the alignment mark and a mark provided to the substrate in a state in which the coating material is disposed on the substrate at a portion where the alignment mark and the substrate are opposite to each other; and
effecting alignment of the substrate with the mold in an in-plane direction of the pattern area on the basis of the information in a state in which the pattern area and the coating material contact each other.

Still another aspect of the present invention is to provide a pattern forming method for forming a pattern on a member, to be processed, by using a pattern provided to a mold, comprising:

preparing a mold provided with a first surface including a pattern area, a second surface located opposite from the first surface, a first mark provided at the first surface, and a second mark for alignment provided at a position at which the alignment mark is away from the first surface; and
effecting alignment of the mold with the member to be processed by using the second mark of the mold and a third mark for alignment provided to the member to be processed.

Yet another aspect of the present invention is to provide a pattern forming method for forming a pattern on a member, to be processed, by using a pattern provided to a mold, comprising:

effecting alignment of the mold with the member to be processed in an in-plane direction of a pattern area of the mold by using first positional information about a relative positional relationship between a first mark provided at a surface of the mold at the same level as a pattern area formed surface of the mold and a second mark located away from the pattern area formed surface and using second positional information about a relative positional relationship between the second mark and a third mark provided to the member to be processed.

According to another aspect of the present invention, there is provided a pattern forming apparatus for performing any one of the pattern forming methods described above, comprising:

a mold holding portion for holding a mold; and a substrate supporting portion for supporting a substrate, wherein the mold holding portion and the substrate supporting portion are configured to be moved relative to each other in an in-plane direction.

Yet another aspect of the present invention is to provide a pattern transfer apparatus, comprising:

an alignment mechanism for effecting alignment of a mold with a member to be processed, the alignment mechanism being configured to effect alignment of the mold with the member to be processed in an in-plane direction of a pattern area of the mold by using first positional information about a relative positional relationship between a first mark provided at a surface of the mold at the same level as a pattern area formed surface of the mold and a second mark located away from the pattern area-formed surface and using second positional information about a relative positional relationship between the second mark and a third mark provided to the member to be processed.

Further, the present invention provides the following molds, processing apparatuses, processing methods, and mold production methods.

More specifically, there is provided a mold having a processing surface at which a pattern is formed and characterized in that it is provided with an alignment structure which is retracted from the processing surface by several micrometers to several millimeters.

In another aspect of the present invention, the mold having the pattern is characterized in that it is provided with an apparatus structure in an area between the processing surface and a surface opposite from the processing surface.

In another aspect of the present invention, the mold having the pattern is characterized in that it is provided with an apparatus structure at a surface opposite from the processing surface.

There is also provided a processing apparatus capable of a mold with a work in a planar direction parallel to a processing surface of the mold when the mold is pressed against the work to transfer a pattern formed on the mold onto the work. More specifically, the processing apparatus includes a mechanism for effecting alignment in a state in which the mold is caused to contact the work. In this case, the apparatus further includes a positional deviation detection mechanism for detecting positional deviation by contact the mold with the work and a mechanism for comparing a detected value of positional deviation with a predetermined value. The apparatus may further include a mechanism for moving the mold away from the contact position toward the processing surface of the mold when positional deviation having a value not less than the predetermined value is detected by the positional deviation detection mechanism.

According to the present invention, there is further provided a processing method including a step shown below during transfer of a pattern formed on the mold onto the work by pressing the mold against the work. More specifically, the processing method is characterized in that in the case when the processing is performed while effecting alignment of the mold with the work in an in-plane direction parallel to the processing surface of the mold, such a step of effecting alignment of the mold with the work by using the above described mold as the mold is performed.

More specifically, the apparatus of the mold with the work in the in-plane direction parallel to the processing surface of the mold is effected in the state of contact of the mold with the work through the following steps (1) and (2):

(1) a positional deviation detection step of detecting positional deviation by contacting the mold with the work and a step of comparing a detected value with a predetermined value, and (2) a step of moving the mold away from the contact position toward the processing surface of the mold when positional deviation having a value not less than the predetermined value is detected in the positional deviation detection step.

The present invention further provides a process for producing a mold having a pattern, to be transferred, at a processing surface thereof.

The mold production process is characterized by including at least one of the following steps (3) to (6):

(3) a step of providing an alignment structure in the mold at a position away from the processing surface of the mold by several micrometers to several millimeters, (4) a step of providing the alignment structure in the mold in an area between the processing surface of the mold and a surface opposite from the processing surface, (5) a step of providing the alignment structure to the mold at the surface opposite from the processing surface of the mold, and (6) a step of providing the alignment structure and forming the pattern at the processing surface simultaneously in the same process. In this case, a mask layer for forming the alignment structure and a mask layer for forming the pattern at the processing surface may preferably be in the same plane.

The present invention further provides a pressure processing apparatus for pressing either one of a mold and a member to be processed (hereinafter also referred to as a processing member) to transfer a pattern formed at a processing surface of the mold onto the processing member.

This apparatus is characterized by an alignment mechanism constituted in the following manner.

More specifically, the alignment mechanism is constituted so that it detects a first relative position between a mark provided at the processing surface of the mold and a mark provided at a position apart from the processing surface toward an inner portion of the mold and a second relative position between the mark provided at the position apart from the processing surface toward the inner portion of the mold and a mark provided with respect to the processing member, and compares these first and second relative positions with each other to effect alignment of the mold with the processing member.

The alignment mechanism is characterized by including a means for storing a result of measurement of the first relative position and a means for storing a result of measurement of the second relative position. The alignment mechanism further includes an optical system for guiding light from a light source to a portion between the mark provided at the position apart from the processing surface of the mold and the mark provided at the processing surface of the mold. The optical system is also configured to guide the light from the light source to a portion between the mark provided at the position apart from the processing surface of the mold and the mark provided with respect to the processing member. The optical system can also be configured to have a reference alignment mark.

The present invention further provides a pressure processing method of pressing either one of a mold and a processing member to transfer a pattern formed at a processing surface of the mold onto the processing member.

More specifically, the pressure processing method is constituted so that it detects a first relative position between a mark provided at the processing surface of the mold and a mark provided at a position apart from the processing surface toward an inner portion of the mold and a second relative position between the mark provided at the position apart from the processing surface toward the inner portion of the mold and a mark provided with respect to the processing member, and includes an alignment step of comparing these first and second relative positions with each other to effect alignment of the mold with the processing member.

The alignment step can include the following steps (1), (2) and (3):

(1) a step of measuring and storing a first error as a horizontal and rotational error of the mark provided at the processing surface of the mold on the basis of the mark provided at the position away from the processing surface of the mold, (2) a step of measuring and storing a second error as a horizontal and rotational error of the mark provided with respect to the processing member on the basis of the mark provided at the position away from the processing surface of the mold, and (3) a step of moving the processing member horizontally and rotationally so that the first error and the second error are in agreement with each other.

Further, the alignment step may include a step of measuring the first error and the second error by using an optical system having a reference alignment mark.

The present invention further provides a mold, for pressure processing, characterized by having a second mark apart inwardly from a horizontal position of a processing surface of a mold on which a pattern is formed, and a first mark formed at a surface at the same level as the processing surface of the mold. The second mark includes a first position measurement mark and an alignment mark corresponding to the mark provided with respect to the processing member, and the first mark includes a second measurement mark corresponding to the first measurement mark. The second mark is provided at a surface opposite from the processing surface of the mold and can be constituted by the presence or absence of a transparent member constituting the mold or a difference in density of the transparent member. Further, the second mark may also be constituted so that it is provided in a second transparent member, constituting the surface opposite from the processing surface of the mold, different in composition from a first transparent member constituting the processing surface of the mold. Further, the second mark may further be constituted so that it is provided at the surface opposite from the processing surface of the mold by embedding a second member, different in composition from the above described transparent member, in a portion at which the transparent member constituting the mold is not present. The second mark may further be constituted by a mark which is provided at the surface opposite from the processing surface of the mold and is protruded from the transparent member constituting the mold at the opposite surface.

The present invention further provides a process for producing a mold for pressure processing, wherein a pattern formed at a processing surface of a substrate is transferred onto a resinous layer provided at a surface of a substrate constituting a processing member. This production process is characterized by including the following steps (1) and (2):

(1) a step of forming a second mark at a position inwardly away from a processing surface of the substrate, and (2) a step of forming a processing pattern and a first mark, after forming the second mark, at a processing surface located opposite from a surface of the substrate on which the second mark is formed, on the basis of a part of the second mark.

The present invention further provides another process for producing a mold for pressure processing, wherein a pattern formed at a processing surface of a substrate is transferred onto a resinous layer provided at a surface of a substrate constituting a processing member. This production process is characterized by including the following steps (3) and (4):

(3) a step of forming a second mark at a position inwardly away from a processing surface of the substrate and forming a first mark, after forming the second mark, at a processing surface located opposite from a surface of the substrate on which the second mark is formed, by irradiation with short pulse laser light from the outside of one surface of the substrate, and (4) a step of forming a processing pattern at the processing surface on the basis of the part of the second mark.

The mold used in the present invention includes a mold having a pattern area at a surface thereof, e.g., a surface uneven (projection and recess) pattern to be imprinted. The mold is also herein referred to as a template in some cases.

The processing member (member to be processed or a work) means an article, including a portion onto which a pattern of the mold is to be transferred, such as a substrate itself or a substrate having thereon a coating material. The coating material on the substrate may be formed in a continuous film or a discontinuous film such as a dot-like film portion. Details thereof will be described later. As the substrate, it is possible to use a flat plate-like member, such as a silicon wafer or quartz wafer, but the present invention is not limited thereto, so long as a member can be used for carrying out the present invention.

According to the above-described constitutions, it is possible to provide a mold capable of being applied to alignment of the mold with a processing member (work) with high accuracy. It is also possible to provide a pattern forming method using the mold, and a pattern forming apparatus and a pattern transfer apparatus, which are used for permitting the pattern formation.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 12A to 12H, 13A to 13I, 14A to 14E, and 15A and 15E are schematic views respectively showing a process for producing a mold according to an embodiment of the present invention.

DETAILED DESCRIPTION OF THE PREFERRED EMBODIMENTS

First Embodiment

Mold 1

A mold according to this embodiment will be described with reference to FIG. 1.

Figure 1:
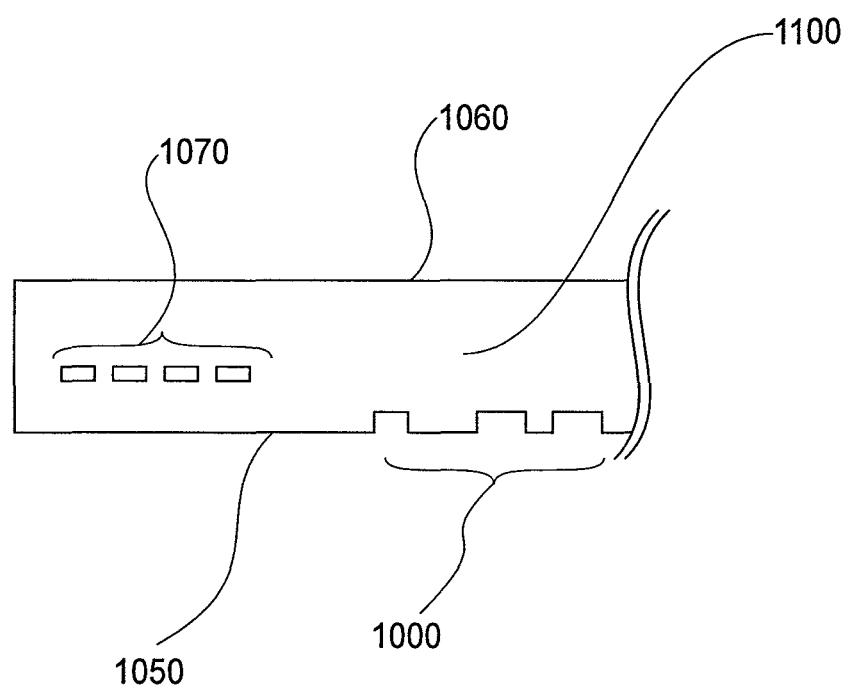
FIGS. 1, 2A to 2D, and 3A to 3D are schematic sectional views each showing a mold according to the present invention.

Referring to FIG. 1, a mold 1100 has a first surface 1050, a second surface 1060 located opposite from the first surface 1050, a pattern area 1000 formed at the first surface 1050, and a mark for alignment (alignment mark) 1070 embedded in the mold 1100 so as not to be exposed to the first surface 1050 and the second surface 1060.

A material for constituting the mold 1100 and a material for constituting the alignment mark 1070 and different from each other, thus providing a difference in refractive index therebetween. The difference in refractive index may preferably be, e.g., not less than 0.1 when optical reading of the alignment mark 1070 is taken into consideration. The material for the alignment mark 1070 is not particularly limited, so long as it can ensure the difference in refractive index with the mold 1100 and can be optically read. For example, the alignment mark 1070 may be constituted by a pore which is in vacuum or filled with gas, such as air or nitrogen.

In this embodiment, it is important that the alignment mark 1070 is embedded in the mold 1100. By such a constitution, during imprinting, it is possible to obviate such a problem that the alignment mark is less read optically due to a resinous layer interposed between a substrate and the mold. Such a problem arises in the case when residue of the resin attaches to the alignment mark or in the case when the difference in refractive index between the mold and the resin is insufficient. In the pattern area 1000, an uneven pattern is formed at the first surface 1050 of the mold 1100. The uneven pattern may also be formed by providing a projection portion on a flat first surface 1050 and then may be transferred onto the substrate.

In the case when the pattern area 1000 and the alignment mark 1070 are read by a single optical system, the alignment mark 1070 may preferably be disposed closer to the first surface 1050 than the second surface 1060 from a viewpoint such that it is possible to adjust focus on both the pattern area 1000 and the alignment mark 1070 simultaneously.

Figure 2A:
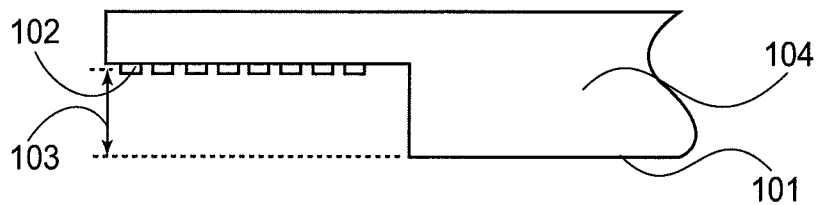
Figure 2B:
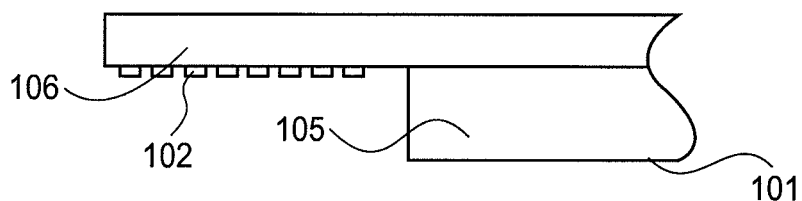
Figure 2C:
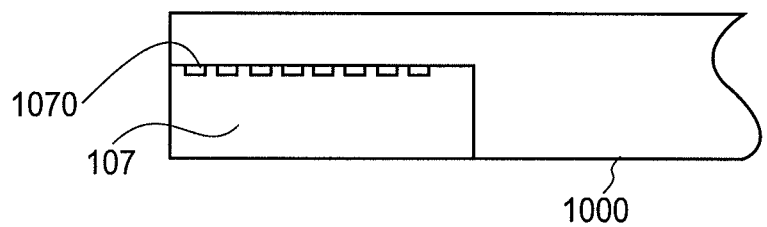

Incidentally, as shown in FIG. 2C, the alignment mark 1070 can also be embedded in a material 107 different from the material for the mold 1100.

Further, the alignment mark can be prepared at the same surface as the first surface 1050 and covered with a protective layer so as not to be exposed outside of the mold. In this case, a material for the protective layer may be identical to the material for the mold, but may be selected as a material having a different refractive index from the mold material. Incidentally, the state in which the alignment mark is not exposed outwardly means that the alignment mark does not directly contact the resin interposed between the mold and the substrate.

In the case of imprinting using a photocurable resin, the mold is constituted by a light transmissive substance such as quartz, pyrex (registered trademark), or sapphire. In the case when it is not necessary to transmit light through the mold, a metallic material or Si can also be used as the material for the mold.

Hereinbelow, a production process of the mold in which the alignment mark is embedded, as shown in FIG. 1, will be described later with reference to FIGS. 13A to 13E and FIG. 14.

From a viewpoint of prevention of attachment of the resin to the alignment mark of the mold during transfer of the uneven pattern of the mold, while interposing the resin between the substrate and the mold, the alignment mark (alignment structure) may also be constituted in the following manner For example, as shown in FIGS. 2A to 2D, such an alignment structure change in optical characteristic, with respect to an in-plane direction at the surface of the pattern area of the mold, is constituted. In these figures, 101 represents a processing surface, 102 represents an alignment structure surface, 103 represents a distance A, 104 represents a mold, 105 represents a mold for a pattern (first member), 106 represents a mold for alignment (second member), and 107 represents a light-transmissive substance.

FIG. 2A shows an embodiment of such a constitution that the alignment structure surface 102 is disposed at a position inwardly away from the processing surface 101 with a certain distance A 103. At this position, the resin does not contact the alignment structure surface 102. The distance A may preferably be set from several micrometers to several millimeters, depending on a focus depth of a microscope.

FIG. 2B shows an embodiment of such a constitution that the first member 105, on which an uneven pattern for transfer is formed and the second member 106 on which the alignment structure 102 is formed, are applied to each other, so that it is possible to easily obtain a constitution that the alignment structure is located away from the uneven pattern.

FIG. 2C shows an embodiment of such a constitution that the alignment structure is embedded in the light-transmissive substance as described above more specifically, and FIG. 2D shows an embodiment of such a constitution that the alignment structure is formed at the surface opposite from the processing surface.

According to a study by the present inventors, in the case when the alignment structure is formed on the same surface side as the processing surface, as shown in FIGS. 2A and 2B, it has been found that the alignment structure may preferably be several microns to several millimeters away from the processing surface toward the opposite surface.

Generally, the resin on the substrate to be processed is coated in a thickness of 1 μm or below, but in consideration of a possibility that the resin is increased in height by pressure application, it is desirable that the resin be located away from the level of the processing surface by several micrometers or above. Further, an accuracy of the mold in terms of structural design is lowered when the distance between the processing surface and the alignment structure is too large, so that the distance may desirably be not more than several millimeters. Herein, the term "several micrometers" means, e.g., 2-3 μm and the term "several millimeters" means, e.g., 2-3 mm. The distance is not limited to these ranges in the case when the alignment structure is located at the surface opposite from the processing surface of the mold or at an inner portion of the mold constituting member.

The alignment structure may be constituted in a shape of, e.g., a box, a cross, or a bar, or as a periodic structure, or a combination of these.

Next, an embodiment of the production process of the mold shown in FIGS. 2A to 2D is described with reference to FIGS. 12A-15E.

(A) Production Process of Mold of FIG. 2a (FIGS. 12A-12H)

Figure 12A:
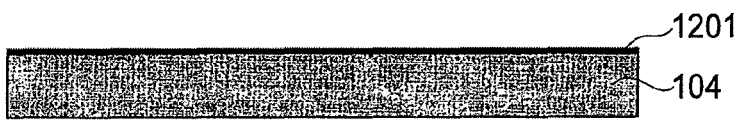

(1) A hard mask layer 1201 is formed on a mold substrate 104 (FIG. 12A).

Figure 12B:
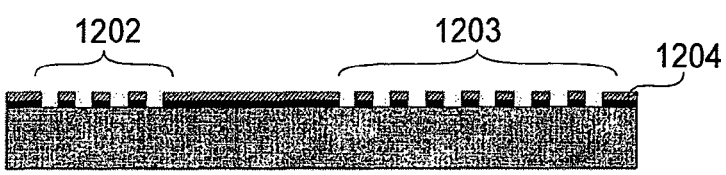

(2) A mask layer 1204 is formed on the hard mask layer 1201, followed by etching of the hard mask layer 1201 (FIG. 12B). Patterning of the mask layer 1204 may, e.g., be effected by light exposure with a stepper or a scanner, or irradiation with an electron beam. In FIG. 12B, 1202 represents an area in which an alignment structure is formed and 1203 represents an area in which an actual pattern is formed.

Figure 12C:

(3) The mold substrate 104 is etched in a desired depth by using, as a mask, the hard mask layer 1201 or a combination of the hard mask layer 1201 with a residual film of the mask layer 1204 (FIG. 12C). In this case, the desired depth means a depth required for imprinting. After this step, in the case where the mask layer 1204 remains, it is removed by a treatment such as ashing, etc.

Figure 12D:

(4) A surface of the mold in an area other than the alignment structure area 1202 is coated with a mask layer 1205 (FIG. 12D).

Figure 12E:

(5) The mold substrate 104 is etched in a desired depth with the hard mask layer 1201 as a mask (FIG. 12E). In this case, the desired depth means a depth which is deeper than the distance A 103 between the alignment structure surface 102 and the processing surface 101 by several tens of nm to several micrometers.

Figure 12F:
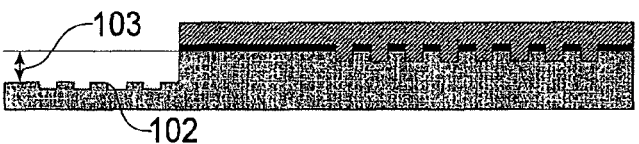

(6) The hard mask layer 1201 is etched by using the mask layer 1205 as the mask and the mold substrate 104 is then continuously etched in the depth corresponding to the distance A 103. The resultant etching surface constitutes the alignment structure 102 (FIG. 12F).

Figure 12G:

(7) The mask layer 1205 is removed (FIG. 12G).

Figure 12H:
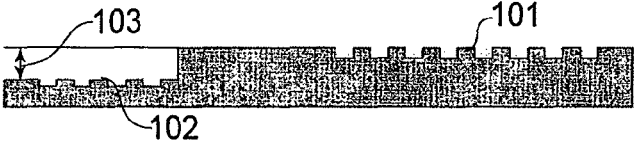

(8) The hard mask layer 1201 is removed (FIG. 12H). In this case, however, when the hard mask layer 1201 is formed of a light-transmissive substance, it is not necessarily removed in this step.

(B) Production Process of Mold of FIG. 2B (FIGS. 13A-13I)

Figure 13A:

(1) On a mold substrate 106, a light transmissive substance 1301 is formed in a film (FIG. 13A). The substance 1301 may desirably be different from a material for the mold substrate 106 so as to ensure selectivity of etching. For example, the light-transmissive substance may be constituted by SiN, $TiO_2$ or $Al_2O_3$, and the mold substrate 106 may be constituted by $SiO_2$, $CaF_2$ or ITO (indium tin oxide).

Figure 13B:

(2) On the film 1301 of the light-transmissive substance, a layer 105 of another light-transmissive substance is formed (FIG. 13B). The substance for the layer 105 may be identical to the material for the mold substrate 106.

Figure 13C:
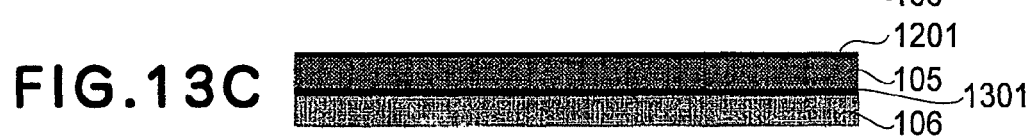

(3) On the layer 105, a hard mask layer 1201 is formed of a light transmissive substance such as SiN, $TiO_2$ or $Al_2O_3$, a metallic material, such as Cr, WSi, or Al; Si, or the like (FIG. 13C).

Figure 13D:
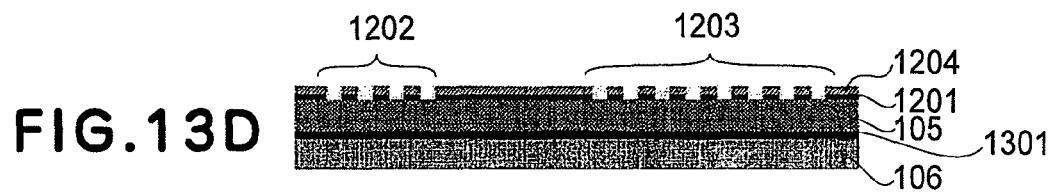

(4) A mask layer 1204 is formed on the hard mask layer 1201, followed by etching of the hard mask layer 1201 (FIG. 13D). Patterning of the mask layer 1204 may, e.g., be effected by light exposure with a stepper or a scanner, or irradiation with an electron beam. A material for the mask layer 1204 may, e.g., be selected from an ordinary resist material used for photolithography, electron lithography, etc. In FIG. 13B, 1202 represents an alignment structure area and 1203 represents an actual pattern area.

Figure 13E:
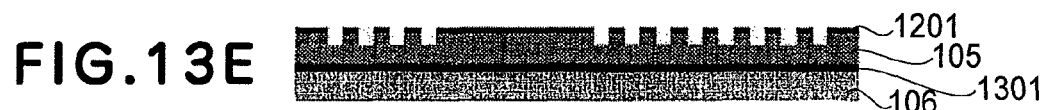

(5) The layer 105 of the light-transmissive substance is etched in a desired depth by using, as a mask, the hard mask layer 1201 or a combination of the hard mask layer 1201 with a residual film of the mask layer 1204 (FIG. 13E). In this case, the desired depth means a depth required for imprinting. After this step, in the case when the mask layer 1204 remains, it is removed by a treatment such as ashing, etc.

Figure 13F:
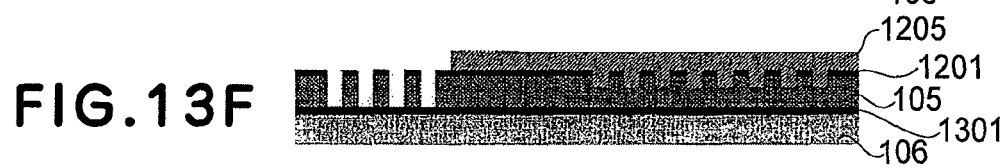

(6) A surface of the mold in an area other than the alignment structure area 1202 is coated with a mask layer 1205, and the layer 105 of light-transmissive substance is etched in a depth reaching the surface of the layer 1301 of the light-transmissive layer by using the hard mask layer 1201 as a mask (FIG. 13F). A material for the mask layer 1205 is selected from the ordinary resist material similar to the above step (4).

Figure 13G:
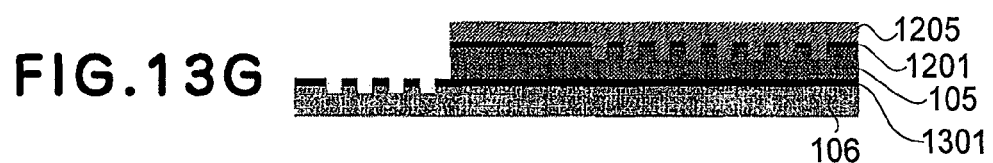

(7) A portion of the light transmissive substance layer 1301 exposed at the bottom of the layer 105 by etching and the hard mask layer 1201 are etched. These etching processes may be performed separately, but may also be performed simultaneously in a common step in some cases. Thereafter, while using the mask layer 1205 as the mask, the layer 105 is etched in a depth reaching the surface of the layer 1301 of the light-transmissive substance (FIG. 13G).

Figure 13H:

(8) The mask layer 1205 is removed (FIG. 13H).

Figure 13I:
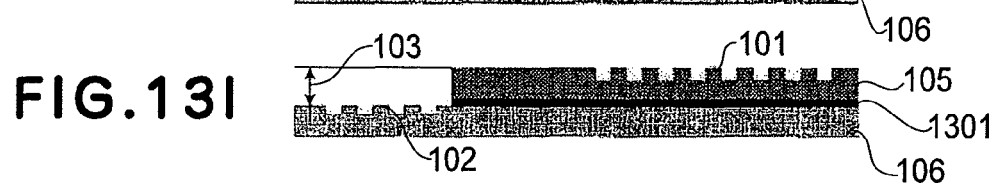

(9) The exposed layer 1301 and the hard mask layer 1201 are removed (FIG. 13I). However, when the hard mask layer 1201 is formed of a light transmissive substance, it is not necessarily removed. The distance A 103 between the alignment structure surface 102 and the processing surface 101 is determined by the thickness of the layer 105. As described above, the mold having the alignment mark 102 at a position disposed inwardly away from the pattern area 101 is realized.

(C) Production Process of Alignment Mark Embedded Mold of FIGS. 1 and 2 (FIGS. 14A-14E)

(1) Similarly, as in the Above Process (B), the Steps Shown in FIGS. 13A to 13E are performed.

Figure 14A:
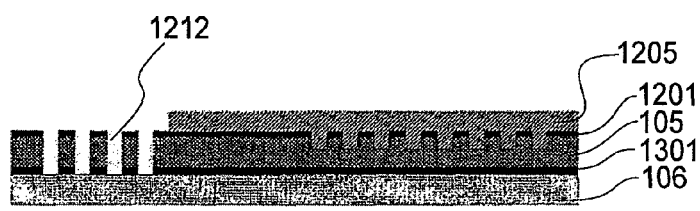

(2) Similarly, as in the step shown in FIG. 13F, the layer 1301 exposed at the bottom of the light-transmissive substance layer 105 by etching is etched by using the mask layer 1205 as the mask (FIG. 14A).

Figure 14B:

(3) At the entire mold surface, a layer 107 of a light-transmissive substance, such as $SiO_2$, inorganic SOG (Spin On Glass), or organic SOG is formed by spin coating, CVD, or the like (FIG. 14B). The layer 107 is formed so as to fill a recessed portion 1212 created by the etching in the step (2).

Figure 14C:

(4) The light-transmissive layer 107 is removed to reach the surface of the mold substrate surface so as to leave a portion thereof filled in the recessed portion 1212 (FIG. 14C). The mold substrate surface means the surface of the hard mask layer 1201 in the alignment structure area 1202 and the surface of the mask layer 1205 in the remaining area, but the former surface takes priority. The removal method may, e.g., be entire-surface etching back or CMP.

Figure 14D:
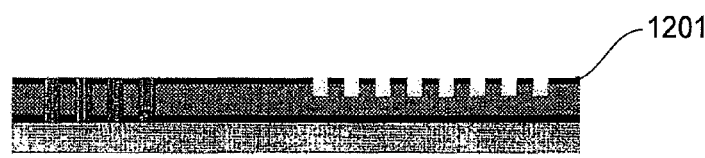

(5) The mask layer 1205 is removed (FIG. 14D). In the case when the light-transmissive layer 107 still remains on the mask layer 1205, it is removed a by lift-off method.

(6) The hard mask layer 1201 is removed (FIG. 14E), but it is not necessarily required to be removed when the material for the hard mask layer 1201 is a light-transmissive substance. The distance A 103 between the alignment structure surface 102 and the processing surface 101 is determined by the thickness of the layer 105. However, in this mold, the light-transmissive substance layer 1301 is embedded in the layers 106, 105, and 107, so that the layer 1301 is required to be well used in combination with these layers 105-107 in terms of optical contrast in order to permit observation of the alignment structure.

Figure 2D:
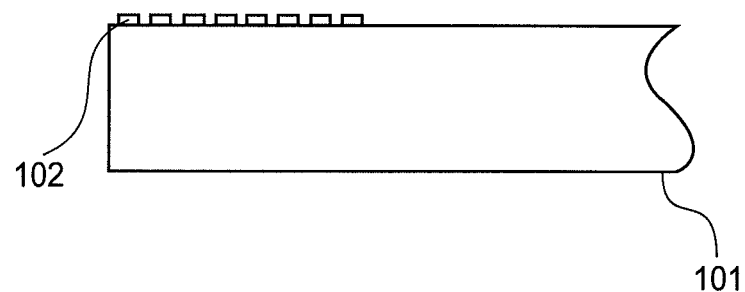
Figure 14E:
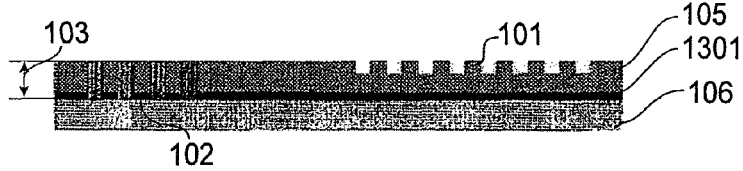

(D) Production Process of Mold of FIG. 2d (FIGS. 15A-14E)

(1) On the surface of a mold substrate 104, a mask layer 1501 is formed (FIG. 15A). The mask layer 1501 may be formed as a resist or a hard mask and has an actual pattern area 1203 and a front/back positional alignment structure area 1502. The mask layer 1501 is patterned by, e.g., light exposure with a stepper, a scanner, or the like, or irradiation with an electron beam.

(2) A mold substrate 104 is etched in a desired depth by using the mask layer 1501 (FIG. 15B). The desired depth in this case means a depth required for imprinting in the actual pattern area 1203.

(3) At a front surface, a protective layer 1503 of a resist, or the like, is formed and, thereafter, at a back surface, a mask layer 1504 is formed (FIG. 15C). The mask layer 1504 has an alignment structure area 1202 and a front/back alignment area 1505, which is optically aligned with the front/back alignment structure area 1502 to adjust a positional relationship therebetween.

(4) The mold substrate 104 is etched in a desired depth by using the mask layer 1504 (FIG. 15D). In this case, the desired depth may be any value so long as the alignment structure can optically ensure a constant.

(5) The resist 1503, the mask layer 1501, and the mask layer 1504 are removed (FIG. 15E). When the mask layers 1501 and 1504 are formed of a light-transmissive substance, these layers are not necessarily required to be removed. The distance A 103 between the alignment structure surface 102 and the processing surface 101 is determined by the thickness of the mold surface 104.

As described above, the mold having the first mark 1077 at the same surface as the pattern area 1203 formed at the processing surface 101 and the second mark 1201 for alignment at the surface opposite from the pattern area-formed surface is realized. Such a mold having two marks will be described more specifically in the Second Embodiment.

In the above description of the mold production process, particularly, the processes shown in FIGS. 12A to 14E have such an advantage that pattern formation at the two different surfaces can be effected at one time. With respect to a sample having a stepped portion, from a relationship of focal depth, it is difficult to obtain a sufficient resolution at both the surfaces in one operation. On the other hand, in the case when pattern formation is effected two times, an error of alignment is added, so that a relative distance between the two patterns is not ensured as designed. In the processes shown in FIGS. 12A-14E, one operation is only required, and it is possible to form the patterns at the different two surfaces with the same resolution.

Second constitutional embodiments in this embodiment are described above, but the mold of the present invention is not limited thereto. Other molds are also embraced in the present invention, so long as they have an alignment structure changed in optical characteristic in an in-plane direction from a processing surface at which an uneven pattern to be transferred onto a work to such an area that the resin does not contact the mold.

In the case when alignment is actually effected with the above-described mold, the alignment is effected by using the alignment structure of the mold and the alignment structure formed on the work or a supporting table of the work.

The above-described mold according to the present invention is applicable to various types of imprinting, such as thermal imprinting, in which resin is thermally settled, but may, particularly, suitably be used for photoimprinting using a photocurable resin.

Second Embodiment

Mold 2

A mold of this embodiment is characterized by including a first surface having a pattern area for transfer, a second surface located opposite from the first substrate, a first mark provided at the first substrate, and a second mark provided at a position away from the first surface toward the second surface. The second mark is, e.g., the mark 102 shown in FIGS. 3A and 3B.

The mold will be described more specifically with reference to FIGS. 3A to 3D.

In these figures, the same reference numerals as those in FIGS. 2A to 2D represent the same members or portions as those described in the First Embodiment.

Referring to FIGS. 3A to 3D, a first mark 1077 is provided at the same surface as a pattern area 101 having an unevenness (not shown). The first surface is a surface at which the pattern area 101 is formed, and the second surface is a surface 3101 opposite from the first surface.

Figure 3A:
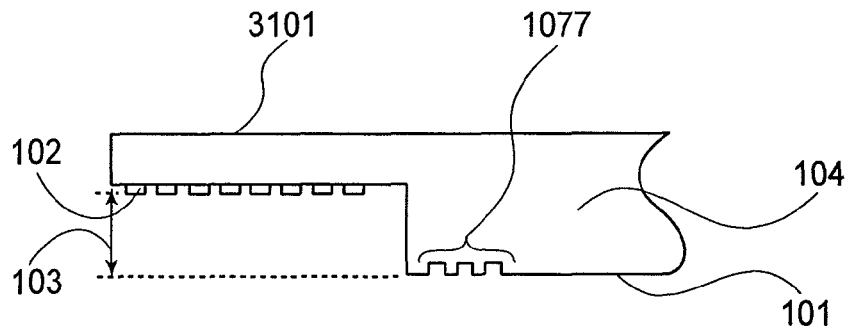
Figure 3B:
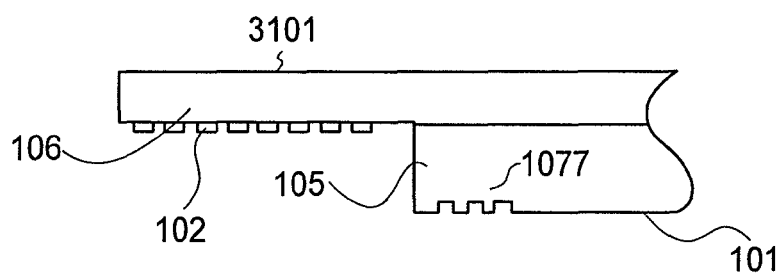
Figure 3C:
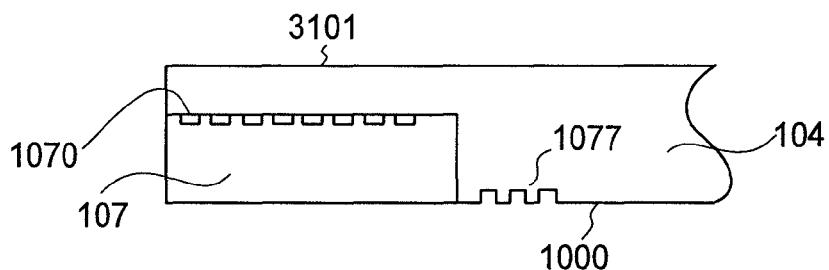
Figure 3D:
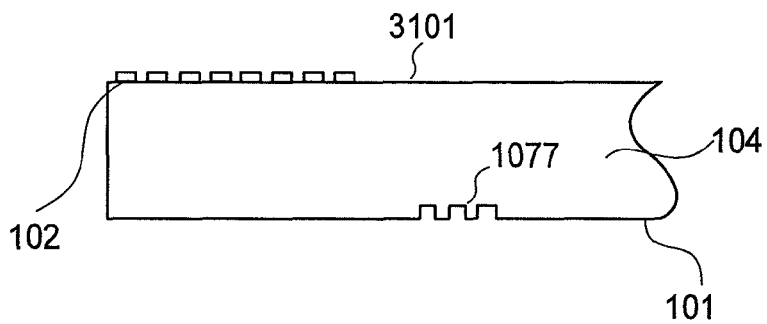

The second mark is provided between the first and second surfaces or at the second surface. In FIGS. 3A and 3B, the second mark is provided at a position inwardly away from the first surface. The second mark may also be embedded in an area between the first and second surfaces, as shown in FIG. 3C, or at the second surface opposite from the pattern area-formed first surface, as shown in FIG. 3D.

For example, a mold having a first mark provided at the same surface as the pattern area and a second mark for alignment at an opposite surface of the mark can be produced through the process shown in FIGS. 15A to 15E described above. The mark 1077 shown in FIG. 15D is the first mark.

Further, as described in this embodiment, the mold having the first mark at the same surface as the pattern area and the second mark at the opposite surface of the mold is shown in FIGS. 20A to 20E.

By providing the alignment mark at two positions, it is possible to effect alignment with one of the alignment marks even in the case when alignment with the other alignment mark is difficult.

Particularly, by providing the first mark (1077 shown in FIGS. 3A-3D) at the same surface as the pattern area and the second mark at the position away from the first mark in the thickness direction of the mold 104, the following effect is expected. More specifically, on the basis of the pattern area 101 (1000 shown in FIG. 3C), the second mark at the back surface is different in position between a designed position and an actually prepared position in some cases. When this difference is practically of no problem in an imprinting process, it is possible to use the mold described in the First Embodiment even when the difference is caused to occur. However, in the case when it is necessary to perform the imprinting process in consideration of the difference, the mold of this embodiment is every effective. This is because, in this embodiment, the second mark is formed in a step other than the step of forming the pattern area, since the unevenness cannot be formed simultaneously at both surfaces of the mold substrate. On the other hand, the first mark can be prepared in the same step as the pattern area, so that the first mark can be formed at a position very close to the designed position. In the mold of this embodiment, it is possible to obtain a relative positional relationship between the first mark and the second mark, so that it is possible to obtain information as to whether the second mark is formed with any error from the designed position with respect to the pattern area or the first mark. Incidentally, the material for the mold (template) may be the same material as those described in the First Embodiment.

Third Embodiment

Pattern Forming Method 1

A pattern forming method of this embodiment is performed in the following manner.

First, a mold provided with a first surface including a pattern area, a second surface located opposite from the first surface, and an alignment mark provided at a position away from the first surface toward the second surface, is prepared. For example, the mold is shown in FIGS. 1 to 3.

Then, the pattern area of the mold and a coating material (e.g., a photocurable resin or resist) of a substrate are caused to contact each other.

Figure 17A:
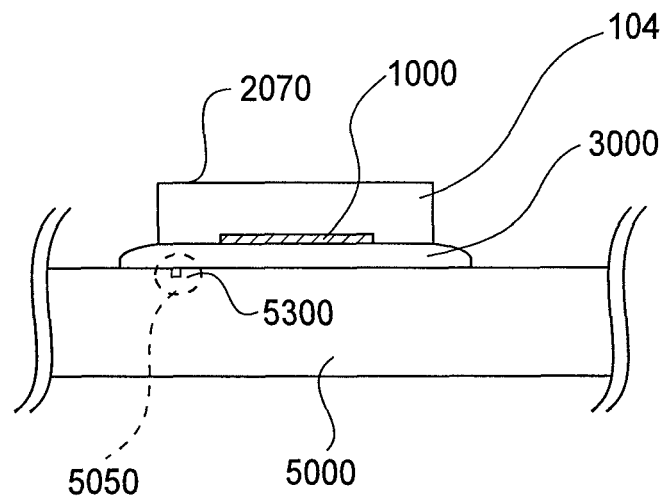
FIGS. 17A and 17B, and 18A and 18B, are views and flow charts each showing a pattern forming method according to an embodiment of the present invention.

In FIG. 17A, 5000 represents the substrate, 3000 represents the coating material, and 104 represents the mold. Further, 1000 represents an area in which an uneven pattern to be transferred onto the coating material is formed. In this figure, an actual unevenness of the uneven pattern 1000 is not shown. An alignment mark 2070 is provided at a back surface of the mold 104 as a position away from the uneven pattern 1000. The position of the alignment mark 2070 in this embodiment is not limited to the position at the back surface of the mold. The coating material 3000 is applied onto the entire surface of the substrate 5000 or an area larger than the pattern area of the mold. As a result, the mold 104 and the substrate 5000 are placed in such a state that the coating material 3000 is disposed at a portion 5050 (dotted circle) on the substrate 5000 opposite to the alignment mark 2070. In this state, information about position of the mold and the substrate (e.g., image information) is obtained by using the alignment mark and a mark provided on the substrate side.

Then, on the basis of this information, (positional) alignment of the mold with the substrate in the in-plane direction of the pattern area is effected. More specifically, the alignment marks 2070 and 5300 are optically read by a single image pickup (sensor) device to effect alignment in the in-plane direction. In the pattern forming method of this embodiment, the alignment can be effected in such a state that the pattern area and the coating material are in contact with each other (contact state). In the present invention, the alignment of the mold with the substrate may also be effected in a non-contact state.

In the case when a difference in refractive index between the mold and the coating material is small, when the alignment mark of the mold is located in the pattern area 1000, the alignment mark cannot be less read optically or cannot be read optically due to the contact of the coating material with the mold. In the pattern forming method of this embodiment, however, the alignment mark 2070 and the coating material 3000 (e.g., resin or resist comprising a material curable by irradiation of light such as ultraviolet rays) are not in contact with each other. Accordingly, it is not necessary to strictly control a coating area of the coating material interposed between the mold and the substrate, so that the coating material can also be prepared by spin coating. It is also possible to form the coating material in the entire pattern area as a continuous film by providing a multiplicity of dot-like portions of the coating material by measures of a dispenser and decreasing a distance between the mold and the substrate.

The coating material is, e.g., photocurable resin and may preferably be cured while effecting the alignment described above. This is because positional deviation is caused to occur in some cases in such a state that the mold and the substrate indirectly contact each other via the resin. In other words, the coating resin may preferably be cured in such a state that a gap between the substrate and the mold is controlled while effecting positional control in the in-plane direction. The curing of the coating material is effected by irradiating the coating material with, e.g., ultraviolet rays from the mold side. Examples of the photocurable resin may include those of urethane-type, epoxy-type, and acrylic-type. It is also possible to use, as the coating material, a thermosetting resin such as phenolic resin, epoxy resin, silicone resin, or polyimide, or a thermoplastic resin such as polymethyl methacrylate (PMMA), polycarbonate (PC), PET or acrylic resin. In this case, the pattern is formed by effecting heat treatment, as desired. As the coating material, it is also possible to use polydimethylsiloxane (PDMS).

In this embodiment, it is also preferable that the following control is effected.

More specifically, on the basis of the information obtained above, control of a distance (gap) between the substrate and the mold is effected.

In some cases, positional deviation in the in-plane direction is caused to occur between the mold and the substrate when pressure is applied to the resin interposed between the mold and the substrate. Particularly, in the case when the positional deviation in the in-plane direction is caused to occur at a level exceeding a predetermined value, when the positional deviation is corrected while retaining the distance between the mold and the substrate, there is a concern about a possibility that the pattern area of the mold is physically damaged. For this reason, in such a case, control of the distance between the mold and the substrate is effected so as to increase the distance. In a preferred embodiment, after the mold is moved away from the substrate to such a position that indirect contact between the mold and the substrate via the resin is released, alignment of both of the mold and the substrate is effected.

As described above, positions of the mold and the work can be deviated from each other as a result of application of a force in a direction parallel to the processing surface (the pattern area formed first surface) of the mold to the mold and the work during transfer of the pattern of the mold. Accordingly, the alignment in the in-plane direction parallel to the processing surface may preferably be effected under pressure application.

Incidentally, in this embodiment, as the substrate, it is possible to use a semiconductor substrate such as a Si substrate or a GaAs substrate, a resin-coated semiconductor substrate, a resinous substrate, a glass substrate, etc. Further, it is also possible to use a multi-layer substrate prepared by growing or laminating a film on the substrate mentioned above. It is further possible to use a light-transmission substrate, such as a quartz substrate. These substrates are similarly used in the embodiments described hereinafter.

The alignment mark to be provided with respect to the substrate may be provided directly with respect to the substrate itself or a film laminated on the substrate, or indirectly on a support member, or a base for supporting the substrate. In the present invention, the substrate provided with the alignment mark includes both the case where the alignment mark is provided with respect to the substrate itself and the case where the alignment mark is provided with respect to the film laminated on the substrate.

Figure 17B:
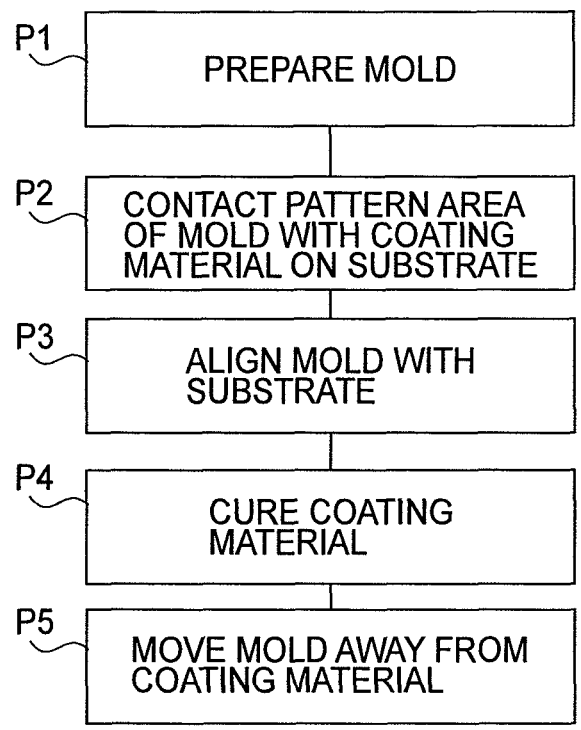

An example (flow chart) of the pattern forming method of this embodiment is shown in FIG. 17B.

Referring to FIG. 17B, first, a mold provided with an alignment mark at a position away from a pattern area is prepared (P1).

The pattern area and a coating material (e.g., photocurable resin) formed on a substrate are caused to contact each other (P2). This operation may preferably be performed after effecting alignment of the mold with the substrate. Incidentally, onto the pattern area of the mold, a fluorine-containing silane coupling agent, or the like, is applied in advance as a release agent, in some cases, in order to permit easy separation between the mold and the substrate after the curing of the resin. Accordingly, in the present invention, the contact of the pattern area (or the mold) with the coating material means both the case where they directly contact each other and the case where they indirectly contact each other via another layer, such as the layer of release agent. This is also true for other embodiments.

Next, in the contact state of the pattern area of the mold with the coating material, alignment of the mold with the substrate is effected (P3). During the alignment, the coating material is also present in the area (5300 shown in FIG. 17A) where the alignment mark in the in-plane direction of the mold and the alignment mark of the substrate are opposite to each other. It is also possible to remove the coating material from the area, but the alignment may preferably be effected even in the presence of the coating material in the area from the viewpoints of alleviation of severe control of the amount of coating of the coating material on the substrate and utilization of spin coating.

The alignment is effected in the following manner.

More specifically, alignment of the mold with the substrate is effected in an in-plane direction of the pattern area-formed surface so that the pattern area of the mold is located at a desired position on the substrate. The mold and the substrate are relatively moved in the in-plane direction to effect the alignment.

During the alignment, as described above in this embodiment, positional adjustment of the mold and the substrate is performed by using the mark provided with respect to the substrate and the alignment mark 2070 provided with respect to the mold. Incidentally, the mold and the substrate are caused to come close to each other so that the gap (distance) between the mold and the substrate is a desired value, as desired. During the gap (positional) adjustment, the positional control in the in-plane direction may be effected or the position in the in-plane direction may be effected after the gap between the mold and the substrate is once adjusted to provide a desired gap value. It is also possible to place the positions of the mold and the substrate in the in-plane direction and the gap therebetween in desired states by alternatively repeating the gap adjustment and the in-plane direction positional adjustment.

Incidentally, measurement of the gap between the mold and the substrate may be performed by utilizing, e.g., a capacitance sensor or white light spectroscopic ellipsometry.

Then, the coating material is cured (P4). In order to cure the coating material, heat or light, such as ultraviolet rays, is utilized. It is also possible to cure the coating material by using heat and light in combination.

Thereafter, the mold is removed from the substrate (P5). As a result, the pattern of the mold is transferred onto the cured coating material. Then, the substrate or the film on the substrate is etched by using the uneven pattern provided on the cured coating material as a mask. The etching may preferably be effected after a recessed portion of the cured coating material layer is removed to expose a portion of the substrate immediately under the coating material layer.

Fourth Embodiment

Pattern Forming Method 2

In a pattern forming method of this embodiment, a mold described in the Second Embodiment is used.

Figure 18A:
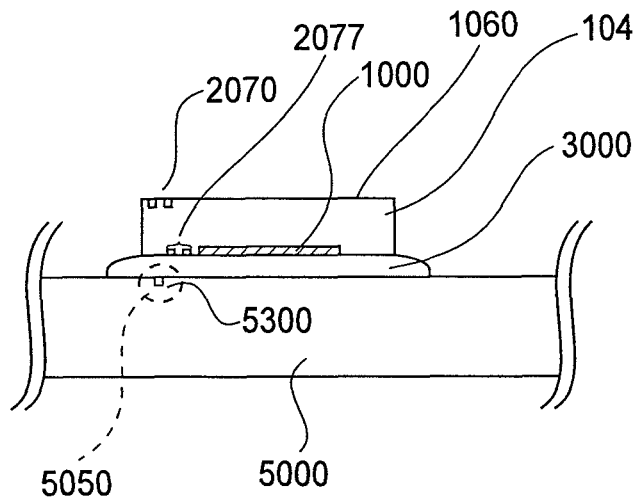

More specifically, as shown in FIG. 18A, alignment of a mold 104 with a substrate 5000 is effected by using a second mark 2070 provided at a position away from a first surface 1050 at which a pattern area 1000 is formed and an alignment mark (third mark) provided with respect to the substrate 5000. In FIG. 18A, 1060 represents a back surface (second surface) of the mold 104 opposite from the first surface 1050.

The substrate 5000 and the coating material 3000 on the substrate 5000 may inclusively be referred to as the member to be processed (processing member), but, in this embodiment, the case where a pattern is directly formed on the substrate itself is also embraced.

In this embodiment, the alignment is effected by optically reading the second mark 2070 and the third mark 5030 from the mold side by means of an image pickup device and relatively moving the mold and the substrate in the in-plane direction so that the second and third marks have a predetermined positional relationship. In this case, either one or both of the mold and the substrate may be moved.

In FIG. 18A, a first mark 2077 is formed at the same surface as the first surface.

In this embodiment, information about the positional relationship between the first mark 2077 and the second mark 2070 is obtained in advance and, by using the information, the alignment of the mold with the substrate may preferably be effected. This is because it is ordinarily difficult to ensure the positional relationship between the pattern area 1000 and the second mark provided at the surface opposite from the pattern area-formed surface on the order of nanometers as designed.

More specifically, even when the second mark is designed so as to be provided at a position away from the pattern area by S in the in-plane direction, in many cases, the second mark is actually provided at a position away from the pattern area by S+α including an error α. On the other hand, the positional relationship between the pattern area and the first mark formed on the surface as the pattern area can be ensured, so that the first mark is actually formed at a position substantially identical to the designed position, on the order of nanometers. For example, in a step of forming the pattern area through an electron beam image forming method, when the mark portion is together formed through the same method, the mark can be formed actually at a position with less error from the designed position.

According to this embodiment, the alignment mark is provided at the two surfaces of the mold, so that it is possible to ensure the positional relationship between the pattern area 1000 and the second mark 2070.

The first mark 2077 is substantially provided at the designed position, although an error of several nanometers can occur. Accordingly, an actual position of the second mark designed to be located at a position away from the pattern area by S can be determined by obtaining information about the positional relationship between the first mark 2077 and the second mark 2070 (e.g., their positions in the in-plane direction). Accordingly, alignment can be effected with high accuracy by utilizing the second mark 2070 and the third mark 5300. In other words, when the first mark is invisible, it is possible to effect the alignment of the mark with the substrate by using the second mark of which the positional relationship with the first mark is determined.

With respect to the positional relationship between the first mark and the second mark, it may be not only directly determined, but also, indirectly determined on the basis of another mark X and information about the positional relationship can also be utilized. In this case, the position of the mark X may preferably be located at the same surface as either one of the first mark and the second mark.

The pattern forming method of this embodiment is also characterized in that the alignment of the mark with the processing member (or the substrate) in the in-plane direction of the pattern area surface is effected by using first positional information about a relative positional relationship between the first mark provided at the pattern area surface and the second mark provided at a position away from the pattern area-formed surface and second positional information about a relative positional relationship between the second mark provided at the position away from the pattern area-formed surface and the surface mark provided with respect to the processing member.

According to the above constitution, it is possible to accurately detect the positions of the mold and the work to effect the alignment of the mold with the work. This is attributable to accurate position detection performed without being adversely affected, even in the case when the photocurable resin contacts the mark by effecting the alignment of the mold with the work under pressure application, different from the conventional pattern forming method, as a result of study by the present inventors.

More specifically, according to the above-described constitution, the alignment can be realized by comparing the relative position of the mark provided at the processing surface and the mark provided at the position away from the processing surface with the relative position of the mark provided at the position away from the processing surface and the mark provided with respect to the processing member. According to such a constitution, even in a state in which the mark provided at the processing surface of the mold contacts the photocurable resin to lower a signal contrast, it is possible to align the position of the mold with the position of the substrate.

More specifically, a positional relationship between the mark provided at the surface of the mold and the mark provided at a surface away from the surface via a member when they are projected on a plane parallel to the processing surface of the mold is preliminarily measured by the image pickup device, or the like. This is a necessary measurement since, as described above, it is easy to form a pattern including a mark in the same plane within a desired error, but it is difficult to ensure a positional relationship between the mark provided at the surface of the mold and the mark provided at the position away from the surface of the mold. The measurement can be omitted in the case where the positional relationship therebetween is determined in advance.

Next, a positional relationship between the mark provided at the position away from the mold surface and the mark provided with respect to the substrate is measured by the image pickup device, or the like.

By comparing both of the measured values of the above-described two positional relationships, it is possible to accurately detect the positions of the mold and the substrate.

According to the above-described measurement method, it is possible to transfer the pattern of the mold onto the substrate with high accuracy, even in the contact state of the mark at the processing surface with the photocurable resin.

The above-described pattern forming method can be utilized in semiconductor production technology, production technologies of an optical device such as a photonic crystal and a biochip, such as a μ TAS, etc.

According to an aspect of the present invention, the mold is characterized in that it has the first mark provided at the pattern formed surface and the second mark provided at the position (the image portion or the back (opposite) surface of the mold) away from the horizontal position of the pattern-formed surface. So long as the relative positional relationship between these two marks is determined, positions of these marks are not limited. In the case when the pattern-formed surface (front surface) of the mold is viewed from the back surface side of the mold, i.e., in the case when the pattern formed surface is viewed in a direction normal thereto, both patterns may overlap with each other, but are not necessarily required to overlap with each other. The first mark is not particularly limited so long as it is located at the processing surface of the mold. However, from the viewpoint of preparation of the mold, it is preferable that the first mark is provided at the same horizontal position as the pattern formed surface (processing surface) of the mold.

The third mark provided with respect to the processing member may be provided with respect to the substrate itself constituting the processing member or with respect to the support member for supporting the substrate.

During the positional adjustment, alignment of the mold surface with the substrate to be processed by measuring a positional deviation between the mold and the substrate utilizing the second mark and the third mark, and by controlling well the positional deviation in consideration of the relative position of the first mark and the second mark.

The alignment may preferably be performed through a step of storing first error information as a horizontal and rotational error of the first mark on the basis of the second mark, a step of storing second error information as a horizontal and rotational error of the third mark on the basis of the second mark, and a step of horizontally and rotationally moving the substrate relative to the mark, so that the first error information and the second error information are in agreement with each other.

Further, the alignment may preferably be effected by storing first error information about at least one of a horizontal error or a rotational error between the second mark and the first mark, storing second error information about at least one of a horizontal error or a rotational error between the second mark and the third mark, and effecting at least one of an operation for horizontally moving the processing member relative to the mold and an operation for rotationally moving the processing member relative to the mold by using the first error and the second error.

In the present invention, the alignment in the in-plane direction between the processing member (or the substrate) and the mold (or the pattern area of the mold) at least embraces the following three cases.

More specifically, on the precondition that the pattern area of the mold and the processing member are parallel to each other, there are first and second cases. The first case is the case when both members are relatively moved horizontally or rotationally to effect the alignment. The second case is the case in which both members are relatively moved horizontally and rotationally to effect the alignment. Here, the term "moved rotationally" means, e.g., that the processing surface of the mold is rotated, relative to the substrate, around an axis perpendicular to the surface plane. Further, on the precondition that the processing member and the mold are not parallel to each other, there is a third case wherein both members are relatively rotated so that their surfaces come close to a parallel state. Here, the term "relatively rotated" includes the case where an angle of a normal to the pattern formed surface of the mold with respect to the axis perpendicular to the surface plane is changed.

Figure 18B:
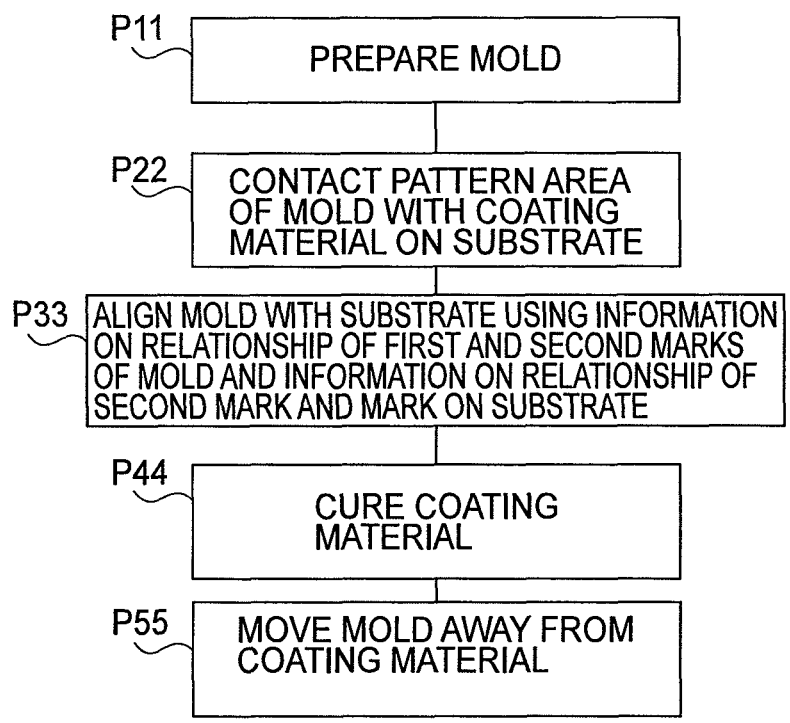

An example (flow chart) of the pattern forming method according to this embodiment is shown in FIG. 18B.

First, the mold having the above-described first and second marks is prepared (P11).

Next, the pattern area and the coating material on the substrate are caused to contact each other (P22). In this example, the substrate having the coating material corresponds to the processing member.

Then, the alignment of the mold with the substrate is effected by optically reading the second mark and the third mark on the substrate side. In this case, the alignment is effected by using information about the positional relationship between the first mark and the third mark of the mold (P33). This information is obtained by reading both of the first and second marks by the image pickup device. As a result, even in the case when the second mark position is not ensured, it is possible to effect high-accuracy alignment using the second mark and the third mark on the substrate side. The alignment to be actually effected is such that the pattern area is adjusted to a desired position on the substrate, so that the alignment is required in some cases so as to obtain the positional relationship such that the second mark and the third mark, which are optically observed, do not overlap with each other.

After the alignment of the mold with the substrate is completed, the coating material is cured (P44). Thereafter, the mold is removed from the substrate (P55). As a result, pattern formation is completed.

The above-described steps P11, P22, P44 and P55 are the same as those in the steps P1, P2, P4 and P5 described in the Third Embodiment with reference to FIG. 17A, so that specific explanations thereof are omitted.

Incidentally, the step P44 is omitted in the case when the processing member is the substrate itself, and the pattern is formed by applying a pressure between the mold and the substrate. In this case, it is also possible to apply heat to the substrate to soften the substrate. Further, in the case of using the substrate itself as the processing member, the mold is removed from the substrate itself in step P55.

The step P33 will be described more specifically.

During the alignment in the step P33, the coating material may be disposed on the substrate so that it is present or not present in the area (5300 shown in FIG. 17A) where the second mark provided on the mold side and the third mark provided on the substrate side are opposite to each other.

More specifically, alignment of the mold with the substrate is effected in an in-plane direction of the pattern area-formed surface so that the pattern area of the mold is located at a desired position on the substrate. The mold and the substrate are relatively moved in the in-plane direction to effect the alignment.

During the alignment, as described above in this embodiment, positional adjustment of the mold and the substrate is performed by using the third mark provided with respect to the substrate and the second mark 2070 provided with respect to the mold. During the positional adjustment, the position of the second mark is deviated from the designed position in some cases, so that the alignment is effected in consideration of the positional relationship between the first mark and the second mark. Incidentally, the mold and the substrate are caused to come close to each other so that the gap (distance) between the mold and the substrate is a desired value, as desired. During the gap (positional) adjustment, the positional control in the in-plane direction may be effected or the position in the in-plane direction may be effected after the gap between the mold and the substrate is once adjusted to provide a desired gap value. It is also possible to place the positions of the mold and the substrate in the in-plane direction and the gap therebetween in desired states by alternatively repeating the gap adjustment and the in-plane direction positional adjustment.

Incidentally, it is also possible to effect a two stage alignment by using the first mark provided at the pattern area-formed surface of the mold and the second mark provided away from the pattern area-formed surface in the thickness direction of the mold. For example, in such a state that the mold and the substrate (or the processing member) are sufficiently apart from each other, a first-stage alignment using the first mark is effected. Thereafter, the mold and the substrate are caused to come gradually near to each other and, e.g., when the first mark is less visible, a second-stage alignment using the second mark is effected.

Fifth Embodiment

Pattern Forming Apparatus

A pattern forming apparatus according to this embodiment is provided with a mold holding portion and a substrate support portion (or a processing member support portion) in order to effect the pattern formation described in Embodiments 3 and 4. The mold holding portion and the substrate support portion are configured to be relatively moved in the in-plane direction.

Further, the pattern forming apparatus may preferably have a positional deviation detection mechanism for detecting the positional deviation between the pattern area of the mold and the coating material in a contact state therebetween and a gap (distance) control mechanism for controlling the gap between the substrate and the mold on the basis of detection information from the detection mechanism.

Next, the pattern forming apparatus provided with the mold according to the present invention will be described.

Figure 4:
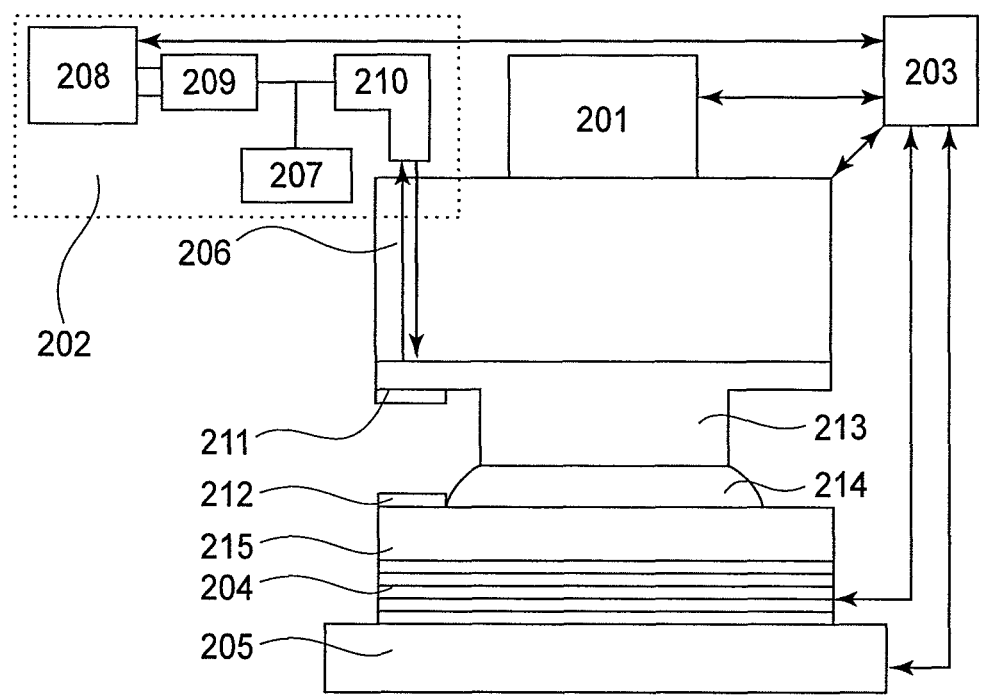
FIG. 4 is a schematic diagram showing an example of a constitution of a processing apparatus in an embodiment of the present invention.

As shown in FIG. 4, the pattern forming apparatus includes a light source 201, an optical measuring system 202, an imprinting control system 203, a work pressing mechanism 204, an in-plane moving mechanism 205, a mold pressing mechanism 206, a light source 207, an analysis system 208, an image pickup device 209, a microscope 210, a mold side alignment structure 211, a work-side alignment structure 212, a mold 213, a photocurable resin 214, and a work 215.

In FIG. 4, such an example that the alignment mark (alignment structure) 211 is provided with respect to the mold 213 at a position away from a pattern area is shown. However, to the mold 213, those described in Embodiment 1 or Embodiment 2 are applicable.

The optical measuring system 202 is provided with a constitution capable of detecting XY-direction information and Z-direction information. Herein, the XY-direction is the above-described in plane direction and the Z-direction is a direction perpendicular to the processing surface. The in-plane direction is, as described above, the direction parallel to the surface at which the pattern area to be transferred is formed.

The information, about the in-plane direction and the Z-direction of the mold 213 and the work 215, measured by the optical measuring system 202, is fed back to the imprint control system 203.

The work pressing mechanism 204 supports the work 215 on the in-plane moving mechanism 205, thus being considered as a work support means.

In this embodiment, it is also possible to use a load cell, not shown, or the like, for measuring a pressure applied to the work 213 and the mold 215.

Next, a processing method using the processing apparatus having the mold will be described with reference to FIGS. 5A and 5B, each showing a flow chart thereof in this embodiment.

Figure 5A:
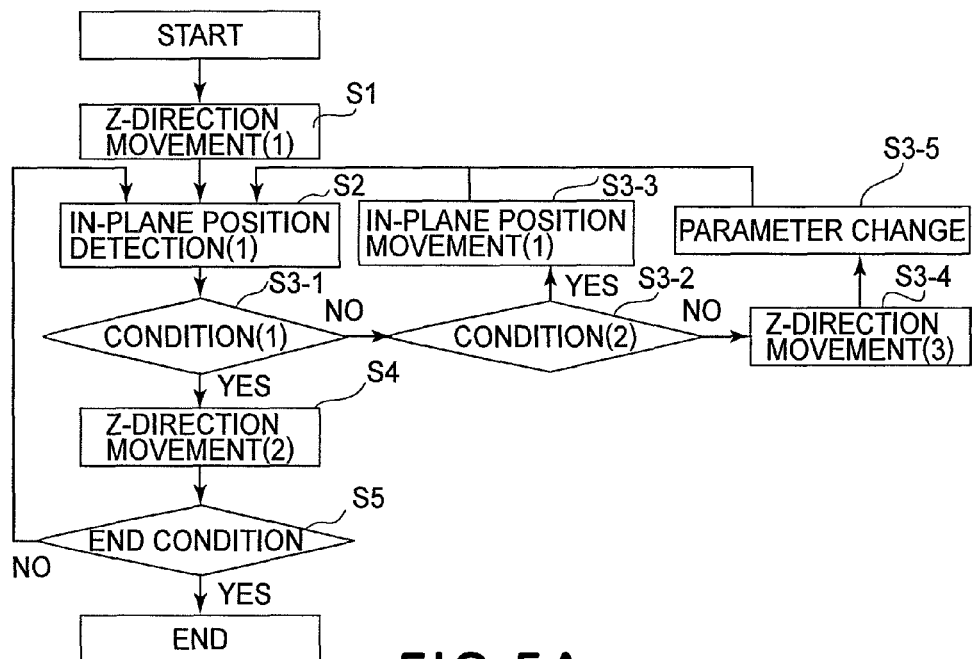
FIGS. 5A and 5B are flow charts each showing a processing method in an embodiment of the present invention.

In FIG. 5A, Step S1 is a step, at a so-called coarse adjustment stage, for effecting Z-direction movement (1) by which the mold is moved to a set position so as to come close to the work with a set distance, while making reference to an encoder of a motor and a Z-direction positional detector. The set distance, e.g., corresponds to a position at which the mold starts to contact the photocurable resin. After the mold is moved to the set position, the operation goes to Step S2, in which in-plane position detection (1) is effected.

Next, the procedure goes to Step S3-1. When the detected value is compared with a set value in the in-plane direction and satisfies Condition (1), the operation goes to Step S4 for performing Z-direction movement (2) as a step at a fine movement stage. In this step, a movement distance may be a predetermined value or changed depending on a distance between the mold and the work. After completing Step S4 at the fine movement stage, the operation is ended when an end condition in Step S5 is fulfilled.

Here, Condition (1) can be set to be, e.g., whether the detected value is less than several fractions of a minimum line width (e.g., several tens of nm) of a pattern. In the case where Condition (1) is not fulfilled, Condition (2) (Step S3-2) is judged. In the case where Condition (2) is fulfilled, the operation goes to Step S3-3 in which movement in the in-plane direction is performed.

Condition (2) can be set to be, e.g., whether the detected value is in a range of more than several fractions of the minimum line width and less than the minimum line width. In the case where Condition (2) is not fulfilled, the operation goes to Step S3-4 in which Z-direction movement (3) is effected to move the mold away from the position after completing the Z-direction movement (1). The moved position may be a position at which the mold contacts the photocurable resin, the position before or during Z-direction movement (1), or the original position. Thereafter, a distance parameter for Z-direction movement (2) may be changed.

The above-described operations are repetitively performed until the end condition in Step S5 is satisfied. A value of the end condition may be a distance or a pressure.

Further, even in a state in which an operation for causing the mold to come close to the work, positional detection of the mold and the work is effected and the detection results are fed back to the in-plane moving mechanism.

Figure 5B:
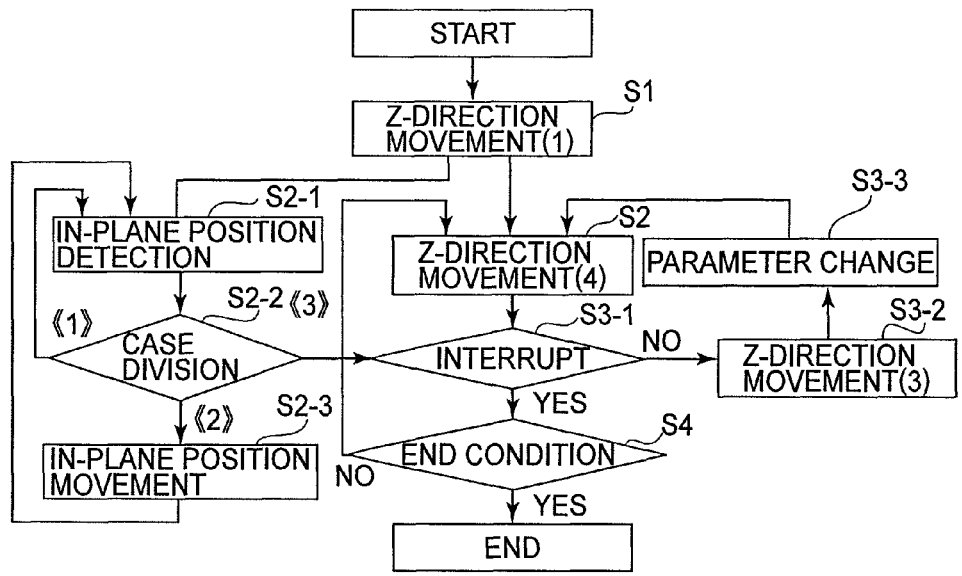

FIG. 5B is a flow chart different from that of FIG. 5A.

Similarly, as in Step S1 of FIG. 5A, after the coarse adjustment for moving the mold to the set position so as to come close to the work with the set distance while making reference to the encoder of the motor and the Z-direction positional detector, Z-direction movement (4) in Step S2 and in-plane position detection in Step S2-1 are performed by parallel processing. Here, Z-direction movement (4) may be controlled by a distance or a speed. Further, these control methods may be changed depending on the direction between the mold and the work. Z-direction movement (4) is continuously performed until an end condition (Step S4) is satisfied or an interrupt (Step S3-1) occurs. The interrupt occurs in the case of satisfying Condition <<3>> of case division in Step S2-2. With respect to the case direction, for example, Condition <<1>> is less than several fractions of a minimum line width, Condition <<2>> is not less than Condition <<1>> and less than the minimum line width, and Condition <<3>> is not less than Condition <<2>>.

In the case where Condition <<1>> is satisfied, the operation is returned to In-plane position detection in Step S2-1. In the case when Condition <<2>> is satisfied, the operation goes to in-plane position movement in Step S2-3 in which in-plane position movement is effected, but the interrupt does not occur. In the case when Condition <<3>> is satisfied, the operation goes to Step S3-1 in which the interrupt occurs.

In the case in which the interrupt occurs, Z-direction movement (3) (Step S3-2) is effected similarly as in Step S3-4 in FIG. 5A.

The above-described operations are performed until the end condition in Step S4 is satisfied.

As described above, after the mold is once caused to contact the photocurable resin, in the case when the position of the mold is largely moved in the in-plane direction while retaining the same Z-direction position when Condition (2) shown in FIG. 5A is not satisfied, there is a possibility that the mold and the work are damaged. For example, in the case when the mold and the work are close to each other (e.g., within several tens of nm), large forces (such as frictional forces) can be generated at the mold surface and the work surface in directions opposite from each other by the movement of the mold in the in-plane direction depending on a viscosity of the photocurable resin. This means that the patterns of the mold and the wafer are damaged. In the imprinting, the patterns of the mold and the work are resistive to a force in a vertical direction as described later, but are liable to be damaged by the force in the in-plane direction as described above.

According to the constitution of this embodiment, when a large positional deviation is detected after the contact of the mold with the work, the mold is once moved away from the work in Z-direction and then is moved in the in-plane direction to obviate the damage described above. Further, as described above, the alignment structure is provided at the position away from the pattern area, so that the alignment structure is not contaminated with the photocurable resin by attachment of the photocurable resin in the state of contact with the photocurable resin, thus permitting accurate positional detection.

The above-described damage of the patterns of the mold and the work in the in-plane direction and the contamination of the alignment structure with the photocurable resin by the contact of the mold with the photocurable resin will be described below more specifically.

Figure 6:
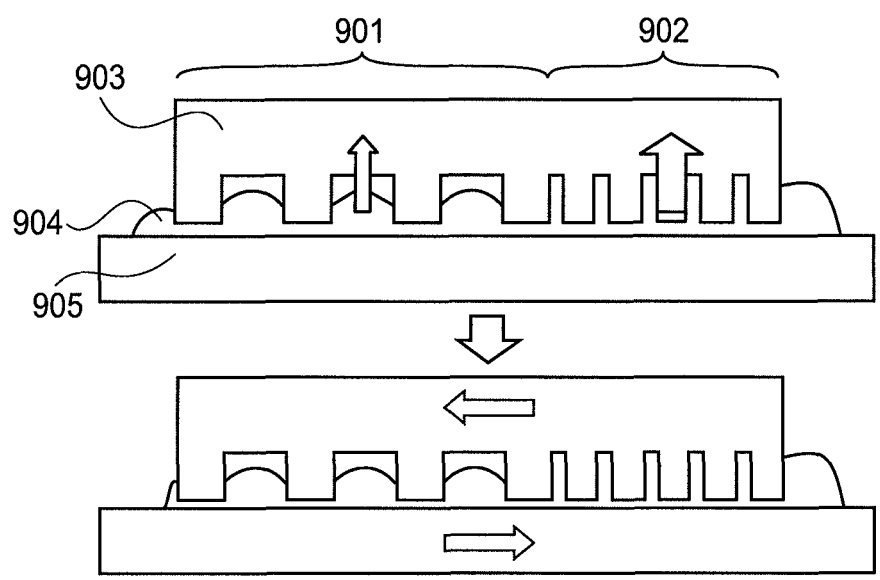
FIG. 6 is a schematic view for illustrating a mechanism of an occurrence of relative positional deviation during imprinting.
Figures 7A, 7B:
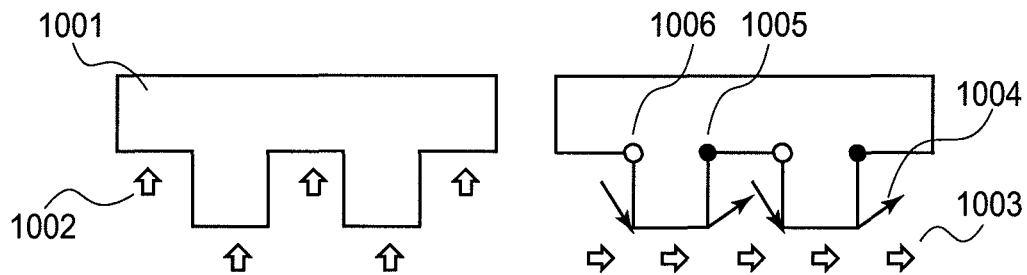
FIGS. 7A and 7B are schematic views for illustrating a mechanism of damage to a mold and a wafer during imprinting.

FIG. 6 and FIGS. 7A and 7B are schematic views for illustrating these particular phenomena in the imprinting.

In FIG. 6, a mold 903 is provided with a broader groove structure (A) 901 and a narrower groove structure (B) 902. On a work 905, a photocurable resin 904 is disposed.

As shown in FIG. 6, in the case when a pattern surface constituted by the broader groove structure (A) 901 and the narrower groove structure (B) 902 in combination is formed on the mold 903, the photocurable resin 904 is first filled in the narrower groove structure (B) 902 when the mold 903 and the work 905 are caused to come close to each other. As a result, stresses applied to the broader groove structure (A) 901 and the narrower groove structure (B) are different from each other, so that an inclination is caused to occur between the mold 903 and the work 905 to result in slippage therebetween. As a result, positional deviation is caused to occur in some cases. An amount of the positional deviation is gradually accumulated with a decrease in distance between the mold and the work. In this case, when the mold and/or the work is moved largely in the in-plane direction, the mold and the work can be damaged in some cases. This is attributable to the following phenomenon described below with reference to FIGS. 7A and 7B.

In these figures, 1000 represents a mold, 1002 represents a force applied in the vertical direction, 1003 is a force applied in the in-plane direction, 1004 represents a torque, 1005 represents an axis during breakage, and 1006 represents a starting point during breakage.

In these figures, the mold is explained, for example, but the work is also similarly applicable.

As shown in FIG. 7A, in the case when the vertically pressing force is applied to the mold, the force is substantially uniformly applied to the entire surface of the mold.

On the other hand, as shown in FIG. 7B, in the case when the force in the in-plane direction is applied to the mold, an interface between the pattern and the substrate does not receive a uniform force. For example, with respect to a pulling force concentrated at edge portions, the mold is liable to be broken with an edge as an axis 1005 and another edge as a starting point 1006. This breakage is noticeable when an aspect ratio is larger, since a rotation torque is larger with the larger aspect ratio.

In such a case, according to the processing method of this embodiment, when a large positional deviation is detected after the contact between the mold and the work, the mold is once moved away from the work in the Z-direction, and then is moved in the in-plane direction as described above, so that it is possible to obviate the above-described damage.

Further, with respect to the alignment of the mold with the work, the mold-side alignment structure and the work-side alignment structure are optically observed by the optical measuring system 202 to effect alignment of these alignment structures.

Figure 8:
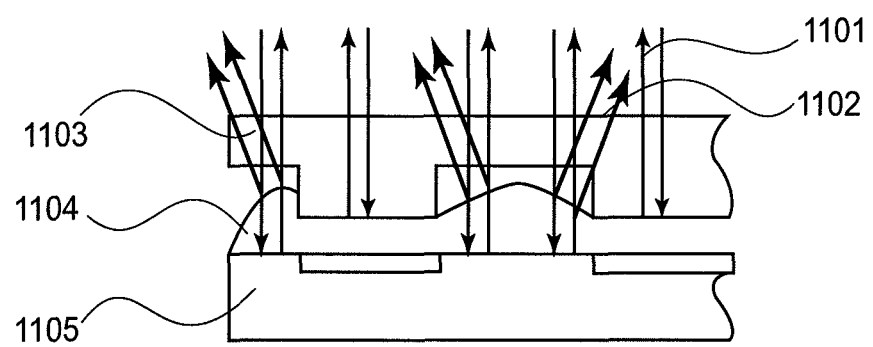
FIG. 8 is a schematic view for illustrating a mechanism of an occurrence of error factors in a detection system during imprinting.

FIG. 8 is a schematic view for illustrating a troublesome state created between the alignment structures of the mold 1103 and the work 1105.

In FIG. 8, 1101 represents detection light, 1102 represents scattering/refracting light, 1103 represents the mold having an alignment structure, 1104 represents a photocurable resin, and 1105 represents the work having an alignment structure.

As shown in FIG. 8, in the case when the photocurable resin 1104 is interposed between the mold 1103 and the work 1105, when a distance between the mold and the wafer is decreased, a surface of the photocurable resin 1104 is not flat. For this reason, the detection light 1101 is scattered or refracted (1102) at the surface of the photocurable resin 1104, so that the alignment structure is unclear. Further, in the case when a difference in refractive index between the photocurable resin and the mold using a light-transmissive alignment structure is small, it is difficult to detect the alignment structure when the mold and the photocurable resin completely contact each other. Further, in the case when the mold is caused to contact the work to detect the positional deviation, before the photocurable resin is cured, and then is once moved away from the work in Z-direction, accurate alignment is prevented when the photocurable resin attaches to the alignment structure of the mold.

In these cases, according to the present invention, if the alignment structure of the mold is provided in such an area that it does not contact the photocurable resin as described above, it is possible to improve an accuracy of the alignment. Incidentally, the above-described mold may suitably be used for the alignment constitution and the position detection method in this embodiment, but other molds capable of providing a necessary detection resolution are also applicable.

Sixth Embodiment

Pattern Transfer Apparatus

A pattern transfer apparatus according to this embodiment has an alignment mechanism for effecting alignment of a mold with a member to be processed, the alignment mechanism is characterized by being configured to effect alignment of the mold with the processing member (the substrate) in an in-plane direction of a pattern area of the mold by using first positional information about a relative positional relationship between a first mark provided at a surface of the mold at the same level as a pattern area formed surface of the mold and a second mark located away from the pattern area formed surface and using second positional information about a relative positional relationship between the second mark and a third mark provided to the processing member.

More specifically, as the pattern transfer apparatus of this embodiment, it is possible to utilize the same apparatus as that described with reference to FIG. 4.

As a characteristic feature of this embodiment, actual alignment is effected by using the second mark and the substrate-side third mark. During this alignment, alignment is effected in consideration of the first positional information about the relative positional relationship between the first mark and the second mark.

The second mark is, as described above, provided at a position deviated from the actually designed position with an error in some cases. Accordingly, in consideration of this error, alignment of the second mark with the third mark can be effected. In other words, alignment can be substantially effected by the first mark and the third mark.

In this embodiment, the alignment mechanism may preferably include a first storing portion for storing the first positional information and a second storing portion for storing second positional information.

Embodiment 1

A mold having an uneven pattern according to the present invention is used so that the uneven pattern is pressure-transferred onto a processing member (member to be processed) formed of resin by imprinting.

FIGS. 9A to 9E are schematic views for illustrating an imprint process.

In these figures, 401 represents a work (substrate in the embodiments described above), 402 represents a mark, 403 represents a photocurable resin, 404 represents a third alignment structure (third alignment mark), 405 represents a second alignment structure (second alignment mark), 406 represents an uneven pattern of the mark 402, and 407 represents a light incident direction.

In this embodiment, as a material for the mold 402, it is possible to use a light-transmissive substance such as quartz, pyrex (registered trademark), or sapphire. The surface of the mold 402 is principally subjected to microprocessing by EB lithography, FIB, X-ray lithography, etc., or is subjected to replica formation from electroformed Ni, etc. As the work 401, it is possible to principally use a semiconductor wafer such as a Si wafer or a GaAs wafer, a resin-coated wafer, a resinous plate, a glass plate, etc.

Next, the imprint process in this embodiment will be described.

Figure 9A:
FIGS. 9A to 9E are schematic views for illustrating an imprint process in an embodiment of the present invention.

First, the photocurable resin 403 is applied onto the work 401 provided with the third alignment structure 404 (FIG. 9A).

Figure 9B:
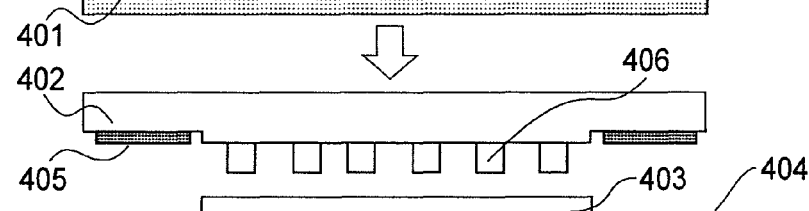

Next, the mold 402 provided with the second alignment structure 405 and the work 401 are disposed opposite to each other to effect alignment of the mold 402 with the work 401 (FIG. 9B). More specifically, the alignment can be effected by, e.g., a box, a cross, a bar, a moire fringe, or the like. By observing these shapes or fringes and subjecting them to image processing, it is possible to effect the alignment. Details of the apparatus will be described later. In FIG. 9B, the second alignment structure 405 as the second mark is provided at the position away from the mold surface. The second mark, however, can also be provided at such a position that it does not contact the resin as described with reference to FIGS. 2A-2D. Further, in FIG. 9B, the resin 403 is not present at a portion where the second mark and the work are opposite to each other, but may be present at the portion.

Figure 9C:
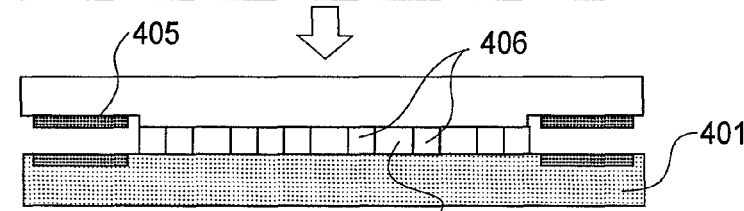

Then, a distance between the mold 402 and the work 401 is decreased, and the mold 402 and the work 401 are kept at a position where a set pressure or a set distance is ensured (FIG. 9C).

Figure 9D:
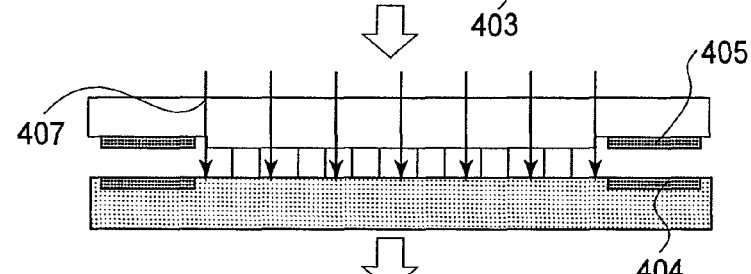

Thereafter, the resultant structure is irradiated with light 407 to cure the photocurable resin 403 (FIG. 9D).

Figure 9E:
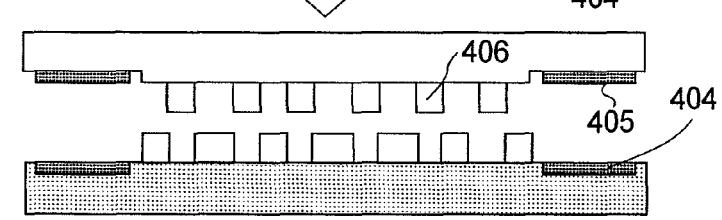

Finally, the mold 402 is moved away from the work 401 to transfer the pattern of the mold 402 onto or into the photocurable resin 403 on the work (substrate) 401 (FIG. 9E).

In this embodiment shown in FIGS. 9A to 9E, the alignment mark (second alignment structure 405) of the mold is formed at the position away from the pattern area surface. However, so long as the mold has such an alignment mark that it does not contact the resin 403, it is also possible to provide the mold 402 with the alignment mark on the back surface of the mold 402, for example.

Figure 10:
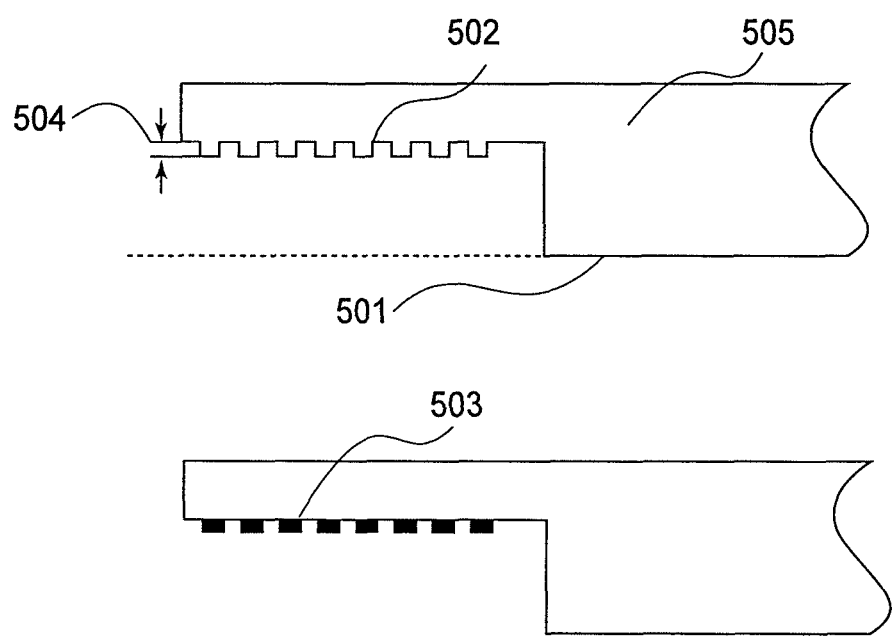
FIG. 10 is a schematic view showing an example of an alignment structure including a periodic structure in an Embodiment of the present invention.

Details of the alignment structure in this embodiment will be described with reference to FIG. 10 showing a constitutional example of an alignment structure having a periodic structure in this embodiment.

In FIG. 10, a mold 505 has a processing surface 501, an uneven pattern 502, a light-blocking film 503, and a height A 504 of the uneven pattern 502.

With respect to the alignment of the mold with a work, in the case when an accuracy of the alignment is larger than an optical resolution, it is possible to use a box, a cross, a bar, etc. In the case of requiring an accuracy less than the optical resolution, it is also possible to employ a high-level image processing or a periodic structure or a combination of these. Incidentally, in the case of using the periodic structure, as shown in FIG. 10, the periodic structure can also be provided as the uneven pattern 502 including grooves or as the light-blocking film 503 of Cr, or the like.

Figure 11A:
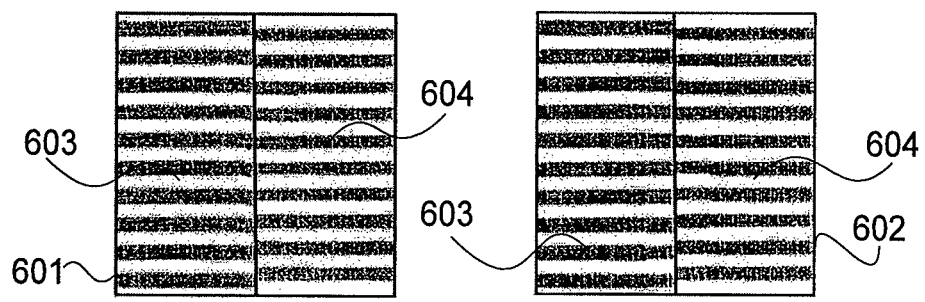
FIGS. 11A and 11B are schematic views each showing an example of an alignment structure using a periodic structure in an Embodiment of the present invention.
Figure 11B:
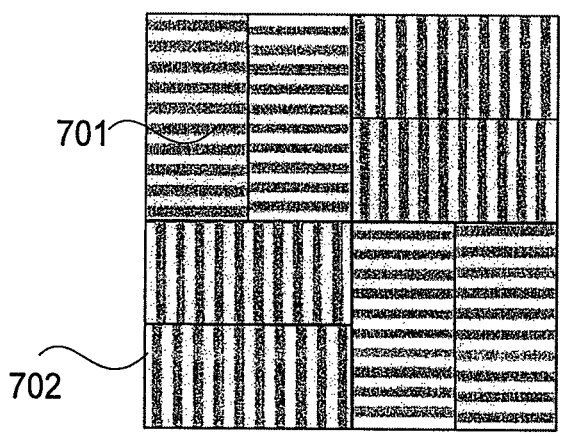

FIGS. 11A and 11B show examples of alignment structures using a periodic structure.

In FIG. 11A, 601 represents a work side alignment structure (A), 602 represents a mold-side alignment structure, 503 represents a pattern having a period p1, and 604 represents a pattern having a period p2. In this example, the patterns 603 and 604 are arranged in parallel with each other.

The mold having the alignment structure (A) 601 and the work having the alignment structure (B) 602 are disposed so that these structures are opposite to each other.

More specifically, the work-side pattern 603 and the mark-side pattern 604 overlap with each other. Further, the work-side pattern 604 and the mark-side pattern 603 overlap with each other. As a result, in each of overlapping two areas, a moire fringe is observed. In the two areas, periods of two moire fringes are identical to each other and when they are in-phase, positions of the mold and the work are matched. In other words, a positional relationship between the mold and the work is determined.

FIG. 11B shows another constitutional example of the alignment structure in this embodiment.

In FIG. 11B, 702 represents a uniaxial alignment structure and 702 represents an X.Y.θ alignment structure.

In order to detect alignment factors (X, Y, θ) in the in-plane direction by a single alignment structure, as shown by the alignment structure 701 in FIG. 11B, the alignment structure 601 shown in FIG. 11A is rotated ninety degrees so as to provide the alignment structure shown in FIG. 11B. The number of the alignment structures may be one, but two alignment structures are required for effecting magnification correction. Further, in order to effect distortion correction, at least one alignment structure is additionally required.

Figure 16A:
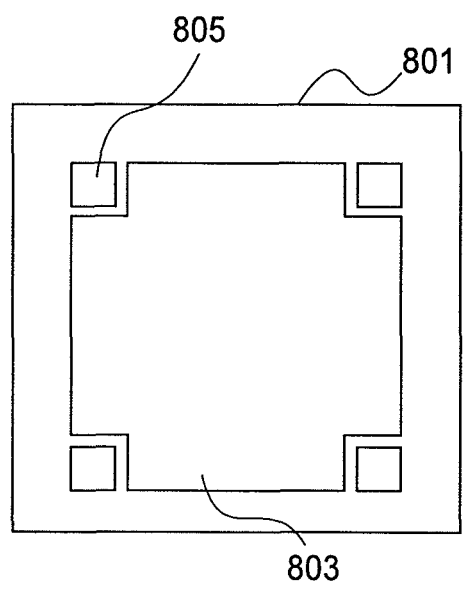
FIGS. 16A and 16B are schematic views each showing an example of an arrangement of an alignment structure in an embodiment of the present invention.
Figure 16B:
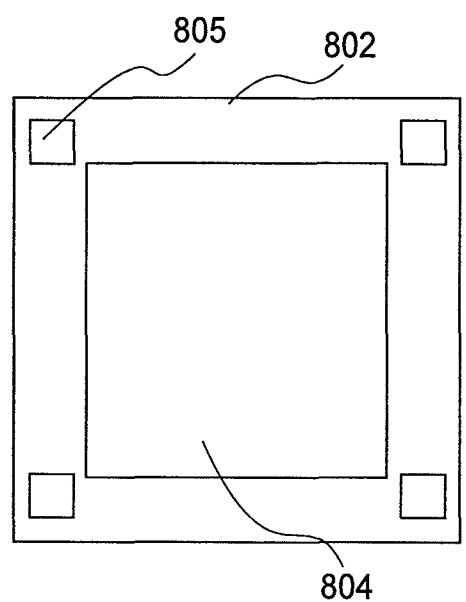

FIGS. 16A and 16B show arrangement examples of the alignment structure.

In these figures, 801 represents a mold (A), 802 represents a mold (B), 803 represents a pattern (A), 804 represents a pattern (B), and 805 represents an arrangement position of the alignment structure.

As shown in the mold (A) 801 of FIG. 16A, the alignment structure is arranged at four corners of the pattern (A) 803, so that redundancy is increased to permit improvement in positional accuracy. Further, as shown in the mold (B) 802 of FIG. 16B, an alignment structure may also be arranged in an area subjected to dicing of the wafer.

According to the embodiment described above, it is possible to realize the alignment of the mold with the work in the in-plane direction with high accuracy.

Embodiment 2

In this embodiment, a constitutional example of the mold according to the present invention is described with reference to FIGS. 19A to 19C.

In these figures, the constitution includes a mold 19101, a pattern area (pattern area) 19102, a first position measuring mark 19103, a first alignment mark 19104 (the second mark in the Second Embodiment), a second position measuring mark 19105 (the first mark in the Second Embodiment), and a processing pattern alignment mark 19106.

Figure 19A:
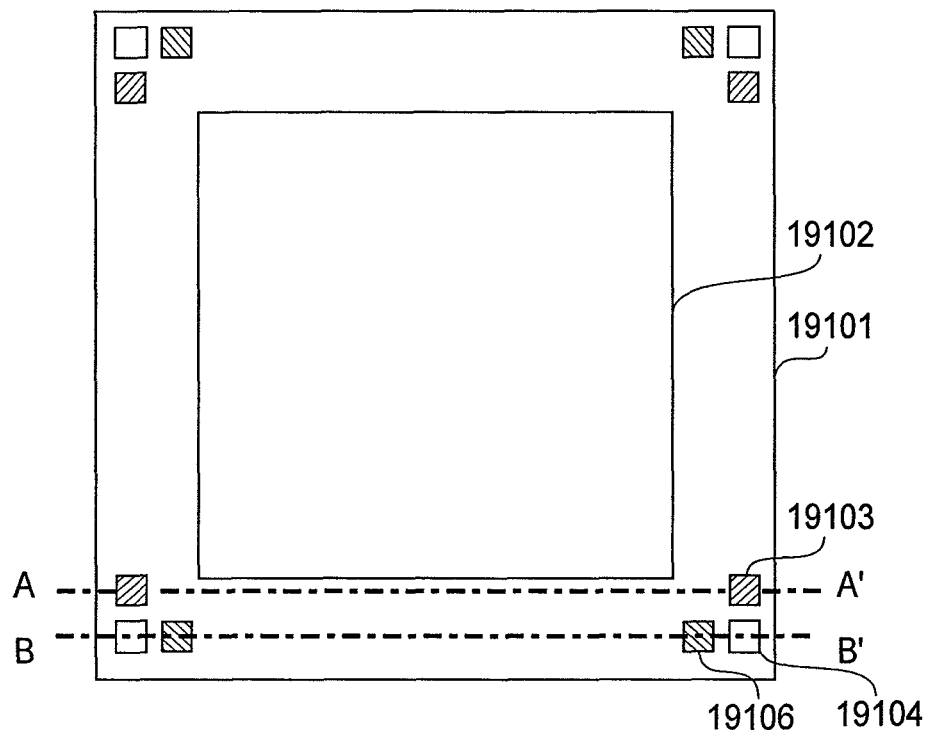
FIGS. 19A to 19C and 20A to 20E are schematic views each showing a constitutional example of a mold in an Embodiment of the present invention.

FIG. 19A is a schematic view of the constitution when the mold 19101 is viewed from a back surface side opposite from the pattern area provided at a front surface of the mold 19101.

Here, the back surface is a surface where there is no processing pattern in the pattern area 19102 and the front surface is a surface where the processing pattern is formed in the pattern area 19102.

At each of four corner portions of the mold 1901 on the back surface side, the first position measuring mark 19103, the first alignment mark 19104 (second mark), and the processing pattern alignment mark 19106 are disposed.

At each of four corner portions of the mold 19101 on the front surface side, the second position measuring mark 19105 (first mark) is disposed.

Incidentally, the position measuring marks 19103 and 19105 are marks for measuring a relative positional relationship between the mark back surface and the surface pattern of the mold. Further, the first alignment mark 19104 (second mark) is a mark for positionally aligning the mold and the substrate relative to each other. The processing pattern alignment mark 19106 is a reference mark during preparation of the processing pattern.

Figure 19B:
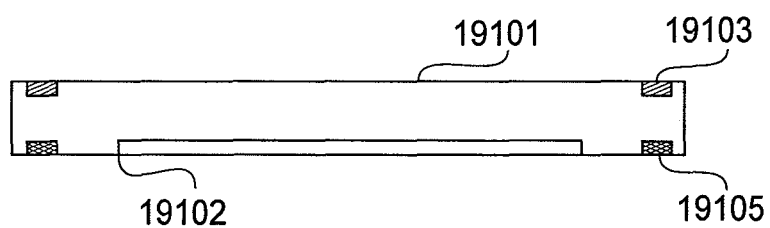

FIG. 19B is an A-A' sectional view of FIG. 19A, wherein the second position measuring mark 19105 (first mark) is disposed at the front surface of the mold, and the first position measuring mark 19103 is disposed at the back surface of the mold.

Figure 19C:
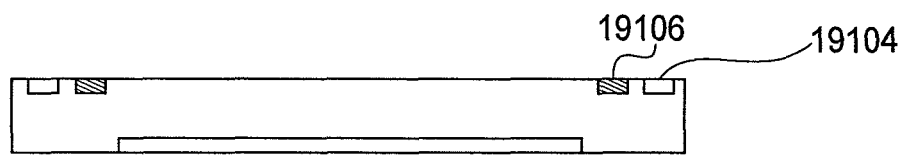

FIG. 19C is a B-B' sectional view of FIG. 19A, wherein the first alignment mark 19104 (second mark) and the processing pattern alignment mark 19106 are disposed at the back surface of the mold.

These marks are constituted so that they are suitable for measuring respective positions and may have ordinary shapes such as a bar, a cross, a circle, a rectangle, and combinations of these.

Incidentally, the first alignment mark 19104 (second mark) and the first position measuring mark 19103 of the mold may only be required to be disposed at positions away from the front surface of the mold via a member. Further, the processing pattern alignment mark 19106 may also be prepared by utilizing the first alignment mark 19104 (second mark).

FIGS. 20A to 20E each shows a constitution example of the marks in this embodiment.

Figure 20A:
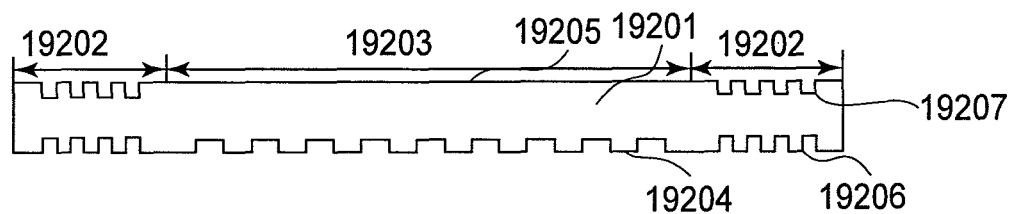

FIG. 20A shows such a constitution that the above-described first position measuring mark, the first alignment mark, and the processing pattern alignment mark are provided at the back surface of the mold by utilizing the presence or absence of or difference in density of the transparent member forming the mold. As shown in FIG. 1, the constitution includes a first transparent member 19201, a mark area 19202, a pattern area 19203, a front surface 19204, a back surface 19205, a front surface-side mark 19206, and a back surface side mark 19207.

The mold is formed of the first transparent member 19201 and has the mark area 19202 and the pattern area (processing area) 19203. The first transparent member can be formed of quartz, pyrex (registered trademark), sapphire, etc.

At the front surface 19204 of the mold, a processing pattern is formed.

At the back surface 19205 of the mold, the first position measuring mark, the first alignment mark, and the processing pattern alignment mark are formed in the mark area 19202. Further, in the mark area 19202, the second position measuring mark is formed at the front surface of the mold as the front surface-side mark.

Incidentally, in FIG. 20A, the front surface side mark and the back surface-side mark are depicted so that they are coaxially aligned, but may also be formed in such a manner that they are relatively shifted in a horizontal direction. The processing pattern alignment mark may also be formed at the front surface of the mold depending on the mold production process.

Figure 20B:
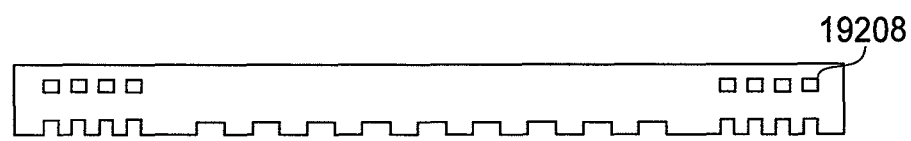

FIG. 20B shows such a constitution that the marks (mark group) provided at the back surface of the mold in the constitution shown in FIG. 20A are provided at an inner portion 19208 of the mold. The inner portion 19208 is formed by utilizing the presence or absence or a difference in density of the transparent member constituting the mold.

Figure 20C:
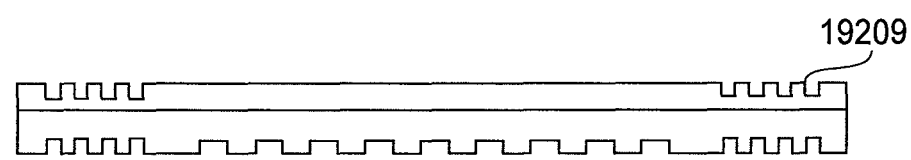

FIG. 20C shows such a constitution that the marks (mark group) provided at the back surface of the mold are constituted as a mark 19209 provided with respect to a second transparent member. The second transparent member is formed of quartz, pyrex (registered trademark), sapphire, ITO, titanium oxide, etc., and may be somewhat different in composition from the first transparent member.

Figure 20D:
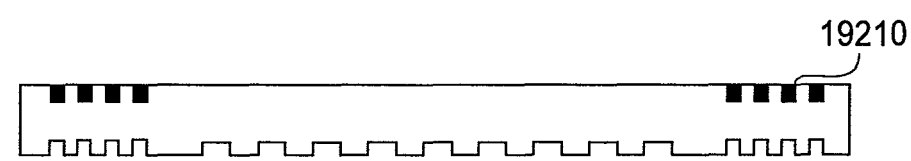

FIG. 20D shows such a constitution that the mark group is constituted by a mark 19210 provided at the back surface of the mold at a portion free from the first transparent member by embedding the mark group formed of the second transparent member in the portion.

Figure 20E:
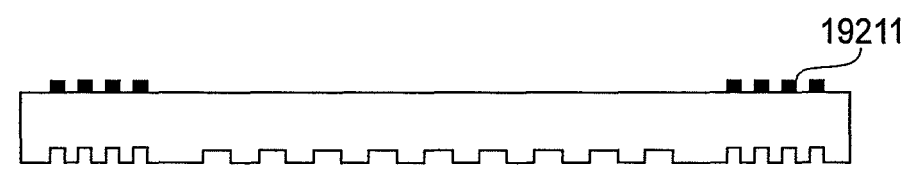

FIG. 20E shows such a constitution that the mark group is constituted by a mark 19211, formed of the second transparent member, provided at the back surface of the mold at a portion projected from the first transparent member.

In the case of the constitutions shown in FIG. 20D or FIG. 20E, the second transparent member may also be changed to a metallic member, or the like.

Embodiment 3

In this embodiment, a process for producing the mold according to the present invention is described.

FIGS. 21A to 21G show steps of the mold production process in this embodiment, wherein processing is effected by turning the mold upside down. In this process, first, one surface of the mold is processed and then the other surface of the mold is processed.

Figure 21A:
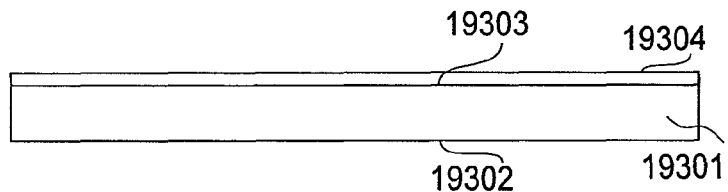
FIGS. 21A to 21G are schematic views showing steps of a process for producing a mold according to an Embodiment of the present invention, wherein a front surface and a back surface of the mold are changed to prepare the mold.

More specifically, first of all, a substrate 19301, of a transparent member onto which a resist 19304 is applied, is prepared (FIG. 21A). The substrate 19301 has a front surface 19302 on which a processing pattern is disposed and a back surface 19303.

Figure 21B:
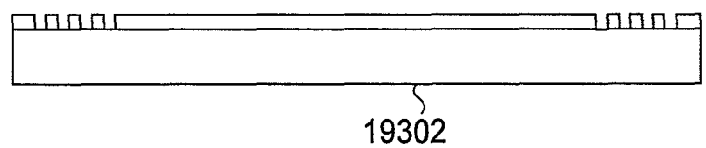

Next, in order to create a mark group at the back surface of the substrate, light exposure and development are effected (FIG. 21B). The mark group includes the first position measuring mark, the first alignment mark, and the processing pattern alignment mark.

Figure 21C:
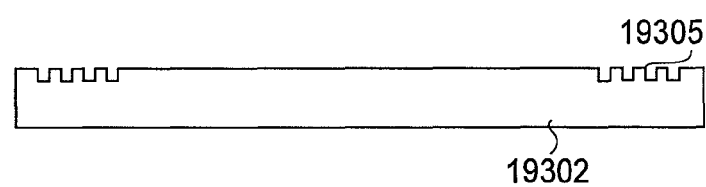

Then, the substrate is etched to transfer a mark group 19305 at the back surface of the substrate (FIG. 21C).

Figure 21D:
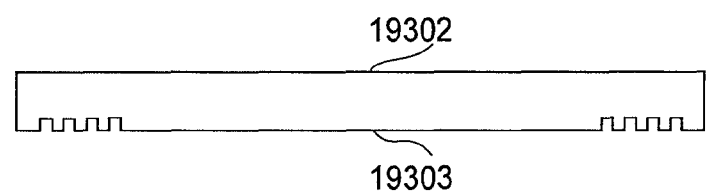

Next, the substrate is turned upside down (FIG. 21D).

Figure 21E:
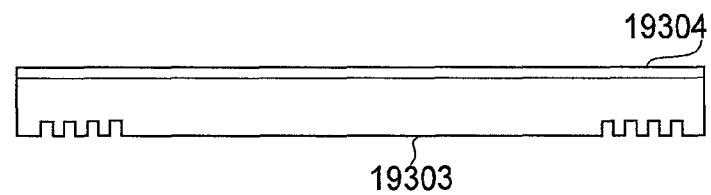

Then, onto the front surface 19302, the resist 19304 is applied (FIG. 21E).

Figure 21F:
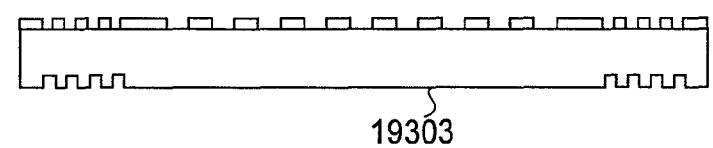

Thereafter, alignment is effected while observing the processing pattern alignment mark at the back surface of the substrate, followed by light exposure and development of a processing pattern 19306 and a second position measuring mark 19307 (FIG. 21F). For this purpose, as a light exposure apparatus, a double-sided aligner is used.

Figure 21G:
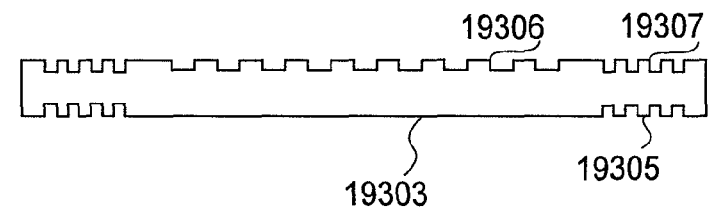

Next, the substrate is etched, and the resist is removed to complete a mold having the processing pattern 19306 and the second position measuring mark 19307 (FIG. 21G).

Incidentally, the front surface portion and the back surface portion may be separately formed on two substrates and then may be applied to each other to prepare a mold having the first mark 19305, the processing pattern 19306, and the second portion measuring pattern 19307.

Generally, in the mold prepared above, positions of the patterns on the same plane are ensured with a desired accuracy.

On the other hand, between different planes, such as the front surface and the back surface, a positional accuracy between the respective planes is low.

Accordingly, it is considered that the first alignment mark, the first position measuring mark, and the processing pattern alignment mark are arranged at desired positions. Further, the second position measuring mark and the processing pattern are disposed at desired positions.

On the other hand, a positional relationship between the first alignment mark and the processing pattern is uncertain, since these are not on the same plane as described above.

However, the mold in this embodiment has the first position measuring mark and the second position measuring mark. Accordingly, by using the first position measuring mark and the second position measuring mark, in combination, and measuring a positional relationship therebetween by means of a relative position measuring means configured to be used in a pressure processing apparatus in an Embodiment of the present invention appearing hereinafter, it is possible to clarify the positional relationship.

Embodiment 4

In this embodiment, another mold production process according to the present invention will be described.

Figure 22:
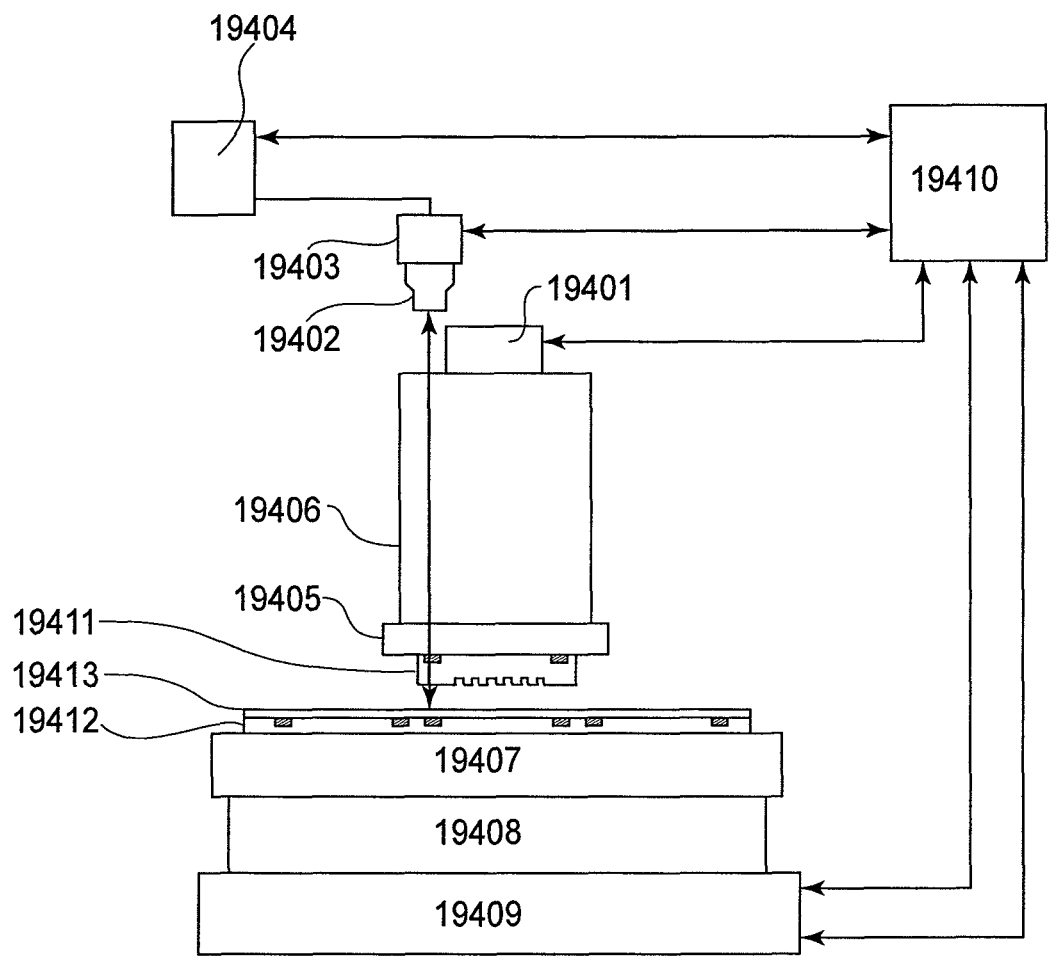
FIG. 22 is a schematic view showing a constitution of a pressure processing apparatus in an Embodiment of the present invention.

FIG. 22 shows a constitutional example of a pattern forming apparatus in this embodiment.

As shown in FIG. 22, the pattern forming apparatus includes an exposure light source 19401, an optical system 19402, an optical system drive mechanism 19403, an analysis mechanism 19404, a mold holding portion 19405, a body tube 19406, a work holding portion 19407, a work pressing mechanism 19408, an in-plane moving mechanism 19409, an imprint control mechanism 19410, and an unshown measuring mechanism for measuring a gap between the mold and the work. In FIG. 22, 19412 represents the work (substrate) and 19413 represents a coating material for coating at least a part of the substrate 19412. The mold 19411 is subjected to chucking with the mold holding portion 19405 so that the mold 19411 is disposed at a position opposite to the work. The work is constituted by the substrate 19412 onto which the coating material 19413 of a photocurable resin is applied by spin coating. The work is movable to a desired position by the in-plane moving mechanism 19409. Further, by the work pressing mechanism 19408, it is possible to effect adjustment of height of the work and pressure application to the work.

The exposure light source 19401 reaches the mold through the body tube 19406.

The imprint control mechanism 19401 controls positional movement of the work, pressure application to the work, the optical system drive mechanism 19403, and light exposure.

In this embodiment, a principal portion of an alignment mechanism for effecting alignment of the mold with the work is constituted by the optical system 19402, the optical system drive mechanism 19403, and the analysis mechanism 19404.

The optical system 19402 is movable to an in-plane direction parallel to the work and a direction perpendicular to the work by the optical system drive mechanism 19403.

Data obtained by the optical system is analyzed using the analyzing mechanism 19404. The analyzing mechanism 19404 is configured to measure a relative position between the mold and the work or a relative position between the front surface and the back surface of the mold and to be capable of storing the measured values thereof.

Next, the optical system in this embodiment will be further described.

Figure 23A:
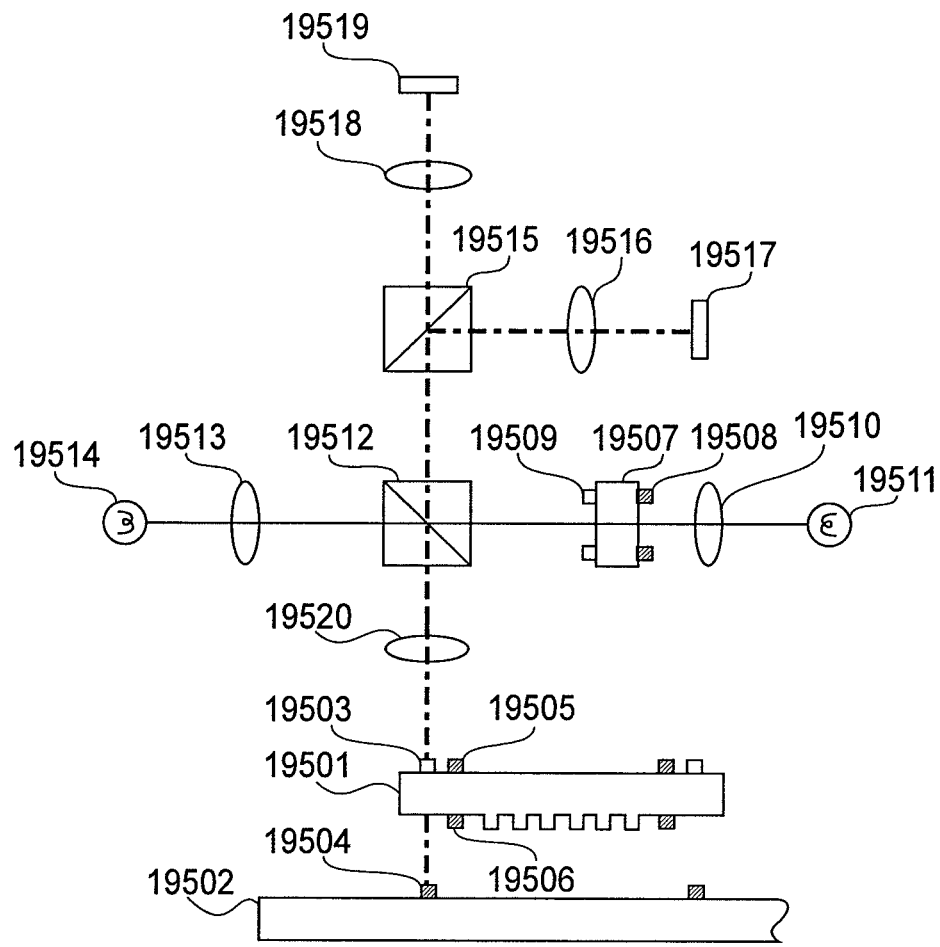
FIGS. 23A and 23B are schematic views for illustrating a constitution of an optical system using a reference mark in a pressure processing apparatus in an Embodiment of the present invention.
Figure 23B:
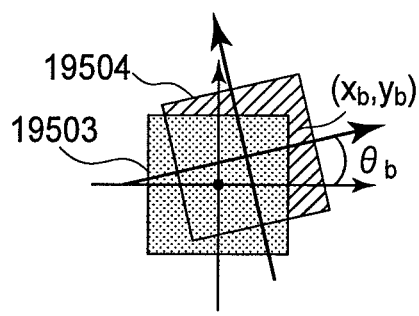

FIGS. 23A and 23B are schematic views for illustrating a constitution of the optical system using reference marks in the pressure processing apparatus of this embodiment, wherein FIG. 23A is a view showing a constitution of the entire optical system and FIG. 23B is a view showing marks observed through an image pickup device.

In this embodiment, the optical system is configured to use reference alignment marks. Such a constitution is, e.g., described in Japanese Laid-Open Patent Application No. Hei 10-335241.

More specifically, first, a mold 19501 and a work 19502 are located opposite to each other with a certain gap therebetween. The work in this embodiment is constituted by the above-described substrate coated with the resin.

The mold in this embodiment has a first alignment mark 19503 (the second mark in the embodiment described above) and a first position measuring mark 19505 at a back surface and has a second position measuring mark 19506 (the first mark in the embodiment) at a front surface.

On the other hand, the work has a second alignment mark 19504 (the third mark in the embodiment).

Next, observation of the first alignment mark 19503 and the second alignment mark 19504 will be described.

Light from a light source 19511 passes through an illumination system 19510 and a reference mark substrate 19507 and is reflected by beam splitters toward second imaging systems 19516 and 19518.

The above-described reference mark substrate is a substrate provided with marks, at the front surface and the back surface, of which a positional relationship is clarified when the marks are projected onto one of the front surface and the back surface. For example, the reference mark substrate is such a substrate that two marks are formed so that the two marks overlap with each other when the marks are projected onto the front surface of the substrate.

Each of a first reference mark 19509 and a second reference mark 19508 is configured to provide an optical conjugation relationship with the following mark group.

More specifically, the first reference mark 19509 is optically conjugated to a mark group A (the first position measuring mark 19505 and the first alignment mark 19503), and the second reference mark 19509 is optically conjugated to a mark group B (the second position measuring mark 19506 and the second alignment mark 19504). As a result, it is possible to measure the positions of the mark group A and the mark group B with respect to the first reference mark and the second reference mark, respectively.

On the other hand, light outgoing from a light source 19514, passes through an illumination system 19513, a beam splitter 19512, and a first imaging system 19520 to be irradiated onto a mark. The reflected light passes through the beam splitter 19512 to transmit toward the second imaging system side. In an image pickup device 19517, the first reference mark 19509 and the first alignment mark 19503 form an image, thus obtaining a first image. On the other hand, in an image pickup device 19519, the second reference mark 19508 and the second alignment mark 19504 form an image, thus obtaining a second image. The image pickup devices 19517 and 19519 in this embodiment are a CCD, or the like.

Next, an alignment method will be described.

First, the pattern forming apparatus of this embodiment is designed so that a pattern area is imprinted at a desired position in the following case during projection of the first position measuring mark 19505 and the first alignment mark 19503 from the back surface side of the mold in a direction perpendicular to the substrate.

More specifically, in the case when the first alignment mark 19503 and the second alignment mark 19504 overlap with each other and the first position measuring mark 19505 and the second position measuring mark 19506 overlap with each other, the pattern forming apparatus is designed so that the pattern area is imprinted at the desired position.

Then, a horizontal/rotational error A (xa, ya, θa) of the second position measuring mark 19506 is measured and stored in advance on the basis of the first position measuring mark 19505. This means that the first and second position measuring marks, designed so as to overlap with each other, are detected as to whether they are actually provided in any positional relationship.

By obtaining the error A (xa, ya, θa), it is found that the imprinting at the desired position can be effected when the alignment of the first alignment mark 19503 with the second alignment mark 19504 is performed so as to result in an error (B'). This is because, in the case when the first and second position measuring marks provided by designing them so as to overlap with each other are actually formed with an error, the first alignment mark 19503 located on the same layer as the first position measuring mark also includes the error. More specifically, the first alignment mark and the first position measuring mark are located on the same layer, so that the position of the first alignment mark is ensured in a relationship with the first position measuring mark. Here, the term "ensured" means that a designed position and a position of the first alignment mark actually formed through the forming process are in agreement with each other with high accuracy.

The alignment of the mold with the work is specifically performed in the following manner.

The first alignment mark 19503 and the second alignment mark 19504 are observed. FIG. 23B shows an image observed through the image pickup (sensing) device.

As shown in FIG. 23B, on the basis of the first alignment mark 19503, a horizontal/rotational error B (xb, yb, θb) of the second alignment mark 19504 is measured and stored. The resultant positional relationship is equivalent to a positional relationship between the processing pattern and the first position measuring mark. The work is moved horizontally and/or rotationally so that the error B is equal to the error B', between the first alignment mark and the second alignment mark, calculated from the above-described error A. In other words, the alignment of the mold with the work is effected so as to satisfy the condition: B=B'. As a result, the processing pattern can be transferred at the desired position.

By the above-described alignment method, even in such a state that the mark at the surface of the mold is invisible due to the contact of the mold with the resin, the positional relationship between the mark and the work can be obtained to permit the alignment therebetween. Incidentally, by using the marks at four corner portions, it is possible to effect magnification correction. Further, depending on reference coordinates, it is also possible to move the work so that the error B' calculated from the error A (xa, ya, θa) and the measured error B (xb, yb, θb) satisfy the equation: B'+B=0.

Embodiment 5

In this embodiment, a process for producing the mold, different from that in Embodiment 3, according to the present invention, is described.

FIGS. 24A to 24E show steps of the mold production process in this embodiment, wherein processing is effected from one side of the mold. In Embodiment 3, the processing is effected by turning the mold upside down. More specifically, first, one surface of the mold is processed and then the other surface of the mold is processed. On the other hand, in this embodiment, both of the front surface and the back surface of the mold are processed from the one side direction.

The mold production process of this embodiment will be described with reference to FIGS. 24A to 24G.

Figure 24A:
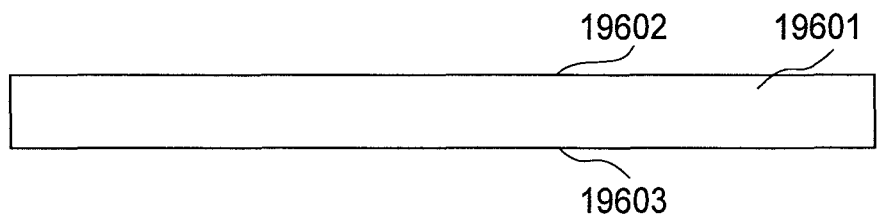
FIGS. 24A to 24E are schematic views showing steps of a process for producing a mold according to an Embodiment of the present invention, wherein the mold is processed from one side thereof.

More specifically, first of all, a substrate 19601 of a transparent member is prepared (FIG. 24A). The substrate 19601 has a front surface 19602 on which a processing pattern is disposed and a back surface 19603.

Figure 24B:
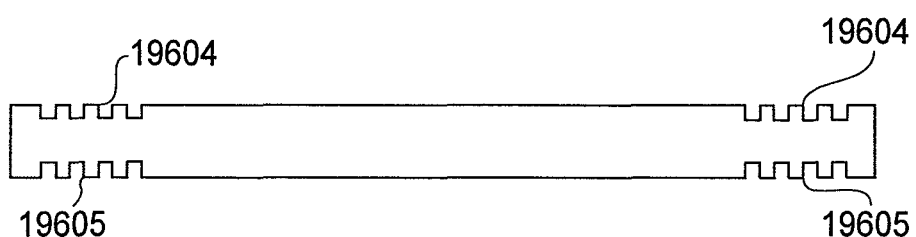

Next, at the back surface of the substrate, a first position measuring mark 19605 is formed and then on the front surface of the substrate, a second position measuring mark 19604 is formed (FIG. 24B).

On the same surface as the first position measuring mark 19605, a first alignment mark (the second mark in the above-described embodiment) is located and on the same surface as the second position measuring mark 19604, a processing pattern alignment mark (the first mark in the embodiment) is located. As a method of successively forming the marks at the front surface and the back surface from one side of the mold, it is possible to employ a method using a femtosecond laser having a high accuracy stage. As a result, the respective marks are disposed at accurate positions.

Figure 24C:
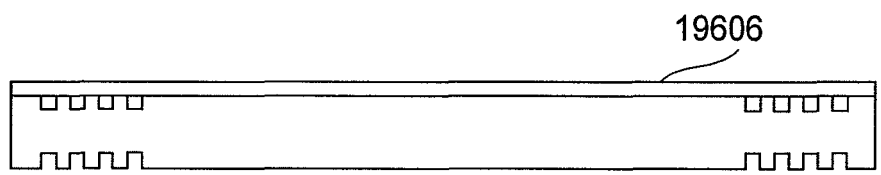

Next, a resist 19606 is applied onto the front surface 19602 of the substrate 19601 (FIG. 24C). The resist layer 19606 also contains a film forming material necessary for forming a reflection prevention film, or the like.

Figure 24D:
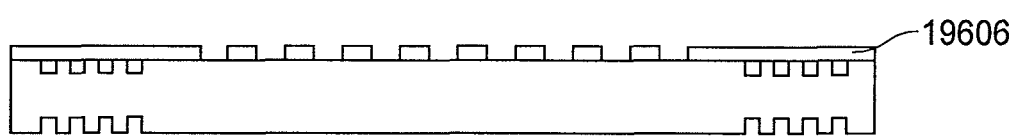

Thereafter, alignment is effected while observing the processing pattern alignment mark at the front surface of the substrate, followed by light exposure and development of a processing pattern (FIG. 24D). For this purpose, as a light exposure apparatus, it is possible to use an electron beam exposure device or a light exposure device, such as a scanner or a stepper. These light exposure apparatuses may be suitably selected depending on a size of the processing pattern.

Figure 24E:
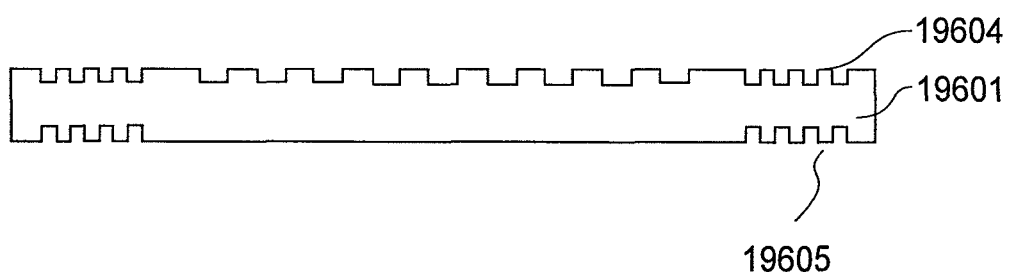

Next, the substrate is etched, and the resist is removed to complete a mold (FIG. 24E).

Incidentally, according to the processing using the femtosecond layer, it is possible to process an inner portion of the mold. Further, in the case when the processing pattern is on the order of micronanometers, it is also possible to effect the processing by the femtosecond laser in place of the light exposure apparatus. Further, in the case of processing the inner portion of the mold, it is also possible to employ such a process that a member is laminated from the front surface side of the mold.

Embodiment 6

In this embodiment, a constitutional embodiment using an optical system, different in constitution from that in Embodiment 4, during pressure processing using the mold of the present invention, is described.

Figure 25:
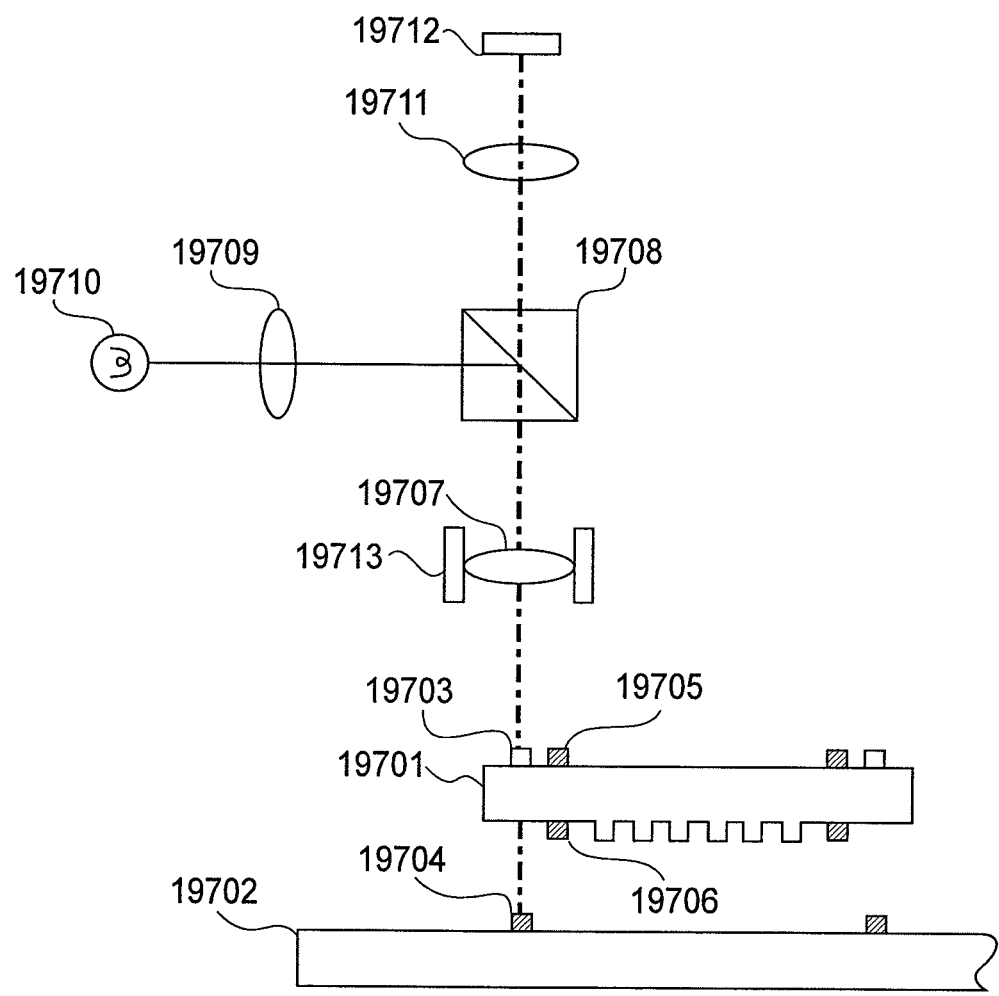
FIG. 25 is a schematic view for illustrating a constitutional example of an apparatus according to an Embodiment of the present invention.

FIG. 25 is a schematic view for illustrating a constitution of the optical system without using a reference mark in this embodiment.

In this embodiment, different from Embodiment 4, the optical system does not use the reference alignment mark.

More specifically, first, a mold 19701 and a work 19702 are located opposite to each other with a certain gap therebetween.

The mold in this embodiment has a first alignment mark 19703 (the second mark in the embodiment described above), a first position measuring mark 19705, and a second position measuring mark 19706 (the first mark in the embodiment). Further, the work has a second alignment mark 19504 (the third mark in the embodiment).

Next, observation of the first alignment mark 19703 and the second alignment mark 19704 will be described.

Light outgoing from a light source 19710, passes through an illumination system 19709, and a first imaging system 19707 to be irradiated onto a mark. The reflected light passes through the first imaging system 19707 and a second imaging system 19711 to be observed through an image pickup (sensing) device 19712. By moving the optical system by means of an optical system drive mechanism 19713, the first marks (the first alignment mark and the first position measuring mark) are observed and stored. Then, by moving the optical system, the second marks (the second alignment mark and the second position measuring mark) are observed and stored.

Next, an alignment method will be described.

First, the first position measuring mark is observed and then the second position measuring mark is observed.

From these two images, a horizontal/rotational error A (xa, ya, θa) of the second position measuring mark 19506 is measured and stored in advance on the basis of the first position measuring mark.

Then, the first alignment mark provided on the mold is observed and then and the second alignment mark provided on the work is observed. FIG. 23B shows an image observed through the image pickup (sensing) device.

From these two images, on the basis of the first alignment mark, a horizontal/rotational error B (xb, yb, θb) of the second alignment mark is measured and stored. Then, the work is moved horizontally and/or rotationally so that an error B' between the first alignment mark and the actually measured error B (xb, yb, θb) satisfy the condition: "B=B'". As a result, the processing pattern can be transferred at the desired position.

While the invention has been described with reference to the structures disclosed herein, it is not confined to the details set forth and this application is intended to cover such modifications or changes as may come within the purpose of the improvements or the scope of the following claims.

What is claimed is:

1. A light transmissive mold used for imprinting a pattern onto a material applied on a semiconductor workpiece, the mold being formed from a substrate of a material, the mold comprising:
    a first outer surface comprising a patterned region and a non-patterned region, the non-patterned region having a surface at a first level, the patterned region having a pattern to be imprinted onto the material, the pattern including a concave portion and a convex portion, the convex portion being disposed at the first level of the non-patterned region;
    a second outer surface located on the mold opposite from the first outer surface in a thickness direction of the mold;
    a stepped portion being disposed inwardly from the first outer surface towards the second outer surface in the thickness direction of the mold, such that the stepped portion is disposed at a second level that is different than that of the non-patterned region with respect to the thickness direction of the mold; and
    a third outer surface provided on the stepped portion, the third outer surface having an alignment structure provided for alignment between the mold and the workpiece, the alignment structure (a) being made of the same material as that of the substrate of the mold, and (b) having a surface that is disposed at a third level that is different than that of each of (i) the stepped portion with respect to the thickness direction, and (ii) the convex portion of the pattern of the patterned region of the first outer surface with respect to the thickness direction, with a distance from the surface of the alignment structure to the convex portion of the pattern of the patterned region of the first outer surface that is not less than 2 μm and not greater than 3 mm, such that the alignment structure does not contact the applied material through the imprinting.

2. A mold according to claim 1, wherein the third outer surface is disposed closer to the first outer surface than to the second outer surface, in the thickness direction.

3. An imprint method of imprinting a pattern onto a material applied on a semiconductor workpiece, the method comprising:
    preparing a light transmissive mold according to claim 1;
    contacting the patterned region of the mold with the material applied on the workpiece;
    obtaining information about relative positions of the mold and the workpiece in an in-plane direction of the patterned region by using the alignment structure formed in the mold and an alignment structure formed in an area of the workpiece that is subjected to dicing, in a state in which the first surface is in contact with the applied material; and
    effecting alignment of the workpiece with the mold based on the obtained information.

4. A method according to claim 3, further comprising controlling a distance between the workpiece and the mold based on the obtained information.

5. A method according to claim 3, further comprising curing the applied material while effecting the alignment.

6. A method according to claim 3, wherein the applied material is one of a photocurable resin, a thermosetting resin, and a thermoplastic resin.

7. A production method comprising:
    imprinting a pattern onto a material applied on a semiconductor workpiece using an imprint method according to claim 3; and
    producing a semiconductor from the workpiece having the imprinted pattern.

8. An apparatus for imprinting a pattern onto a material applied on a semiconductor workpiece, the apparatus comprising:
    a light transmissive mold according to claim 1;
    a mold holding portion configured to hold the light transmissive mold according to claim 1;
    a workpiece support portion configured to support the workpiece;
    a detection mechanism configured to detect a positional deviation between the alignment structure formed in the mold and an alignment structure formed in an area of the workpiece that is subjected to dicing, via a space without the material therebetween, and in a state in which the first surface is in contact with the applied material; and a moving mechanism configured to align the workpiece with the mold based on the detected positional deviation.

9. An apparatus according to claim 8, further comprising a control mechanism configured to control a gap between the workpiece and the mold based on the detected positional deviation.

10. An apparatus according to claim 8, further comprising a light source, wherein the apparatus is configured to cause the light source to cure the applied material while the moving mechanism aligns the workpiece with the mold.

11. A method of producing a light transmissive mold used for imprinting a pattern onto a material applied on a semiconductor workpiece, the method comprising:

patterning a mask layer on a substrate and then etching the substrate via the patterned mask layer to form, in the substrate, an alignment structure and a pattern to be imprinted onto the material, the alignment structure being formed such that the alignment structure is arranged opposite to an area of the workpiece that is subjected to dicing;

etching the alignment structure via the patterned mask layer with the pattern to be imprinted coated with a mask layer; and etching the patterned mask layer via the mask layer and then etching the alignment structure via the mask layer to form an alignment structure disposed at a position inwardly away from the pattern to be imprinted in order to produce a light transmissive mold according to claim 1.

12. A mold according to claim 1, wherein the convex portion of the first outer surface is made of the same material as that of the substrate of the mold.

* * * * *

UNITED STATES PATENT AND TRADEMARK OFFICE
CERTIFICATE OF CORRECTION

| | |
|---|---|
| PATENT NO. | : 9,046,793 B2 |
| APPLICATION NO. | : 13/153512 |
| DATED | : June 2, 2015 |
| INVENTOR(S) | : Nobuhito Suehira et al. |

It is certified that error appears in the above-identified patent and that said Letters Patent is hereby corrected as shown below:

ON THE TITLE PAGE:

In item "(62) Related U.S. Application Data," in line 3, "Jun. 7, 2009," should read -- Jun. 7, 2006, --.

Signed and Sealed this
Twenty-third Day of February, 2016

Michelle K. Lee
*Director of the United States Patent and Trademark Office*